(12) United States Patent
Hiramoto et al.

(10) Patent No.: US 6,717,780 B2
(45) Date of Patent: Apr. 6, 2004

(54) MAGNETORESISTIVE DEVICE AND/OR MULTI-MAGNETORESISTIVE DEVICE

(75) Inventors: Masayoshi Hiramoto, Nara (JP); Nozomu Matsukawa, Nara (JP); Akihiro Odagawa, Nara (JP); Kenji Iijima, Kyoto (JP); Hiroshi Sakakima, Kyoto (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 174 days.

(21) Appl. No.: 09/969,558

(22) Filed: Oct. 2, 2001

(65) Prior Publication Data

US 2002/0067581 A1 Jun. 6, 2002

(30) Foreign Application Priority Data

May 10, 2000 (JP) ........................................ 2000-306783

(51) Int. Cl.⁷ .............................. G11B 5/39; G11C 11/00
(52) U.S. Cl. .................. 360/324.2; 360/324; 360/327.1; 365/158
(58) Field of Search ................................ 360/313–328; 365/97, 158

(56) References Cited

U.S. PATENT DOCUMENTS

| | | |
|---|---|---|
| 5,627,704 A | 5/1997 | Lederman et al. |
| 5,668,688 A | 9/1997 | Dykes et al. |
| 5,880,912 A | 3/1999 | Rottmayer |
| 6,064,552 A | 5/2000 | Iwasaki et al. |
| 6,104,632 A | 8/2000 | Nishimura |
| 6,252,798 B1 | 6/2001 | Satoh et al. |
| 6,327,121 B1 * | 12/2001 | Nagasawa et al. ..... 360/324.11 |
| 6,351,408 B1 | 2/2002 | Schwarzl et al. |
| 6,452,762 B1 | 9/2002 | Hayashi et al. |

FOREIGN PATENT DOCUMENTS

| | | |
|---|---|---|
| EP | 0 534 791 | 9/1992 |
| JP | 10-011720 | 1/1998 |
| JP | 10-320721 | 12/1998 |
| JP | 11-213349 | 8/1999 |
| JP | 11-232618 | 8/1999 |
| JP | 11-509956 | 8/1999 |
| JP | 2000-076844 | 3/2000 |
| JP | 2000-293823 | 10/2000 |
| WO | 99/18578 | 4/1999 |
| WO | 00/10024 | 2/2000 |

OTHER PUBLICATIONS

Korean Office Action dated Oct. 21, 2003.
Japanese Office Action regarding Application No. 2000–306783 dated Oct. 6, 2003.

* cited by examiner

Primary Examiner—A. J. Heinz
(74) Attorney, Agent, or Firm—Renner, Otto, Boisselle & Sklar

(57) ABSTRACT

A magneto-resistive element includes a vertical current type magneto-resistive element; a first conductor for causing a current to flow into the vertical current type magneto-resistive element; and a second conductor for causing the current to flow out of the vertical current type magneto-resistive element. The first conductor generates a first magnetic field based on the current. The second conductor generates a second magnetic field based on the current. The first conductor and the second conductor are located so that the first magnetic field and the second magnetic field act as a bias magnetic field applied on the vertical current type magneto-resistive element.

25 Claims, 26 Drawing Sheets

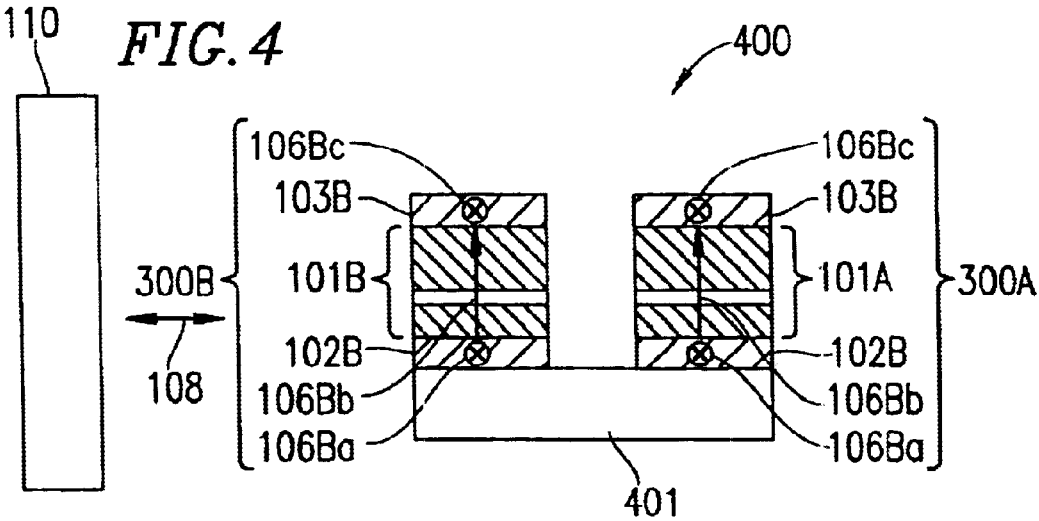
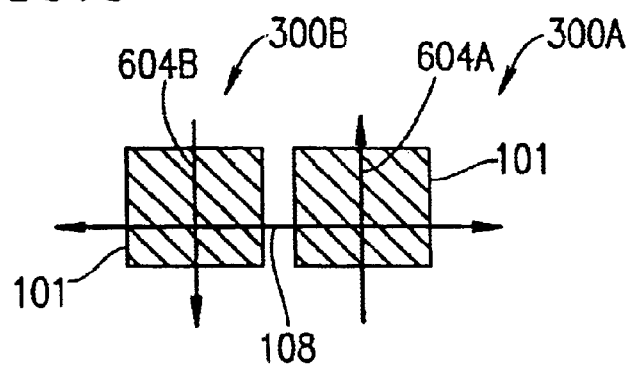
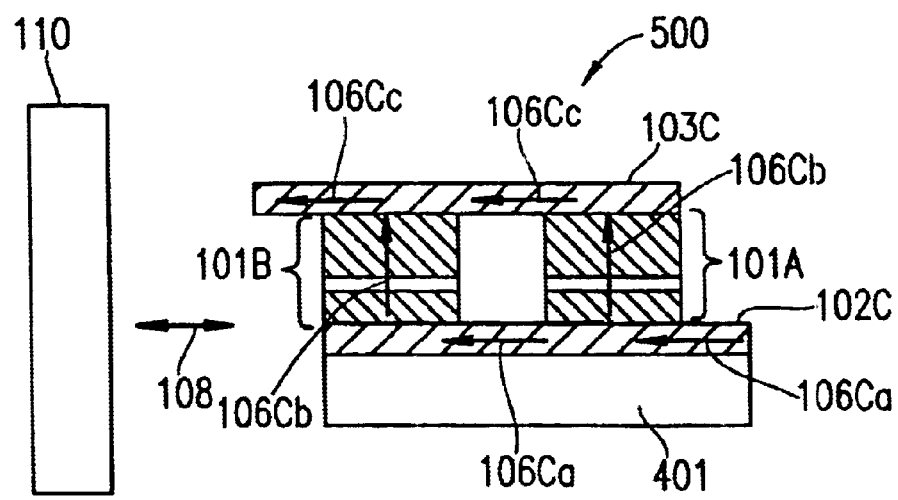

FIG. 22
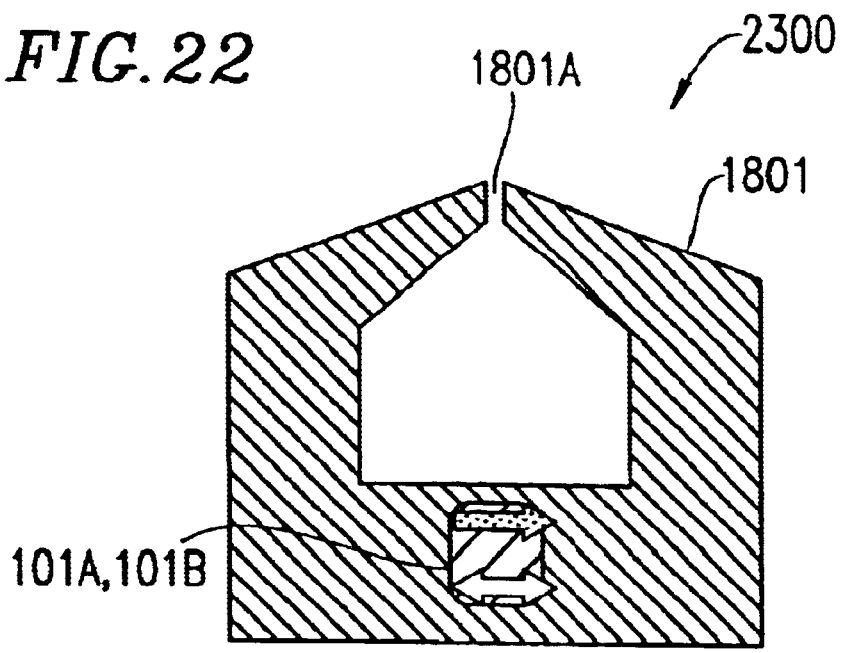
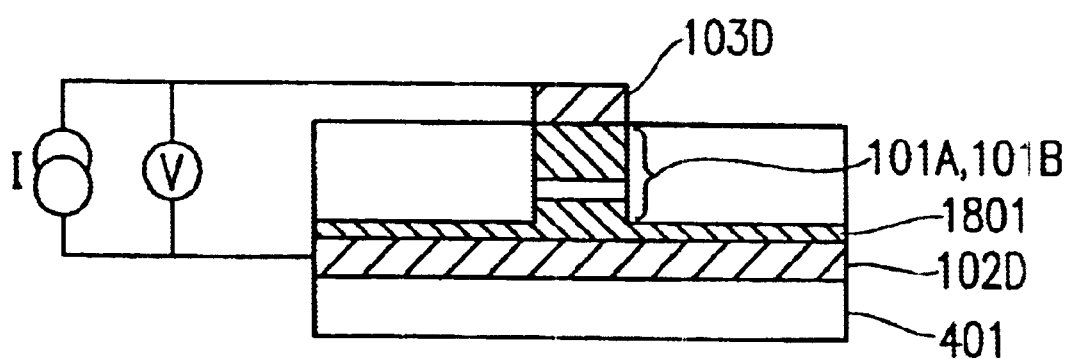

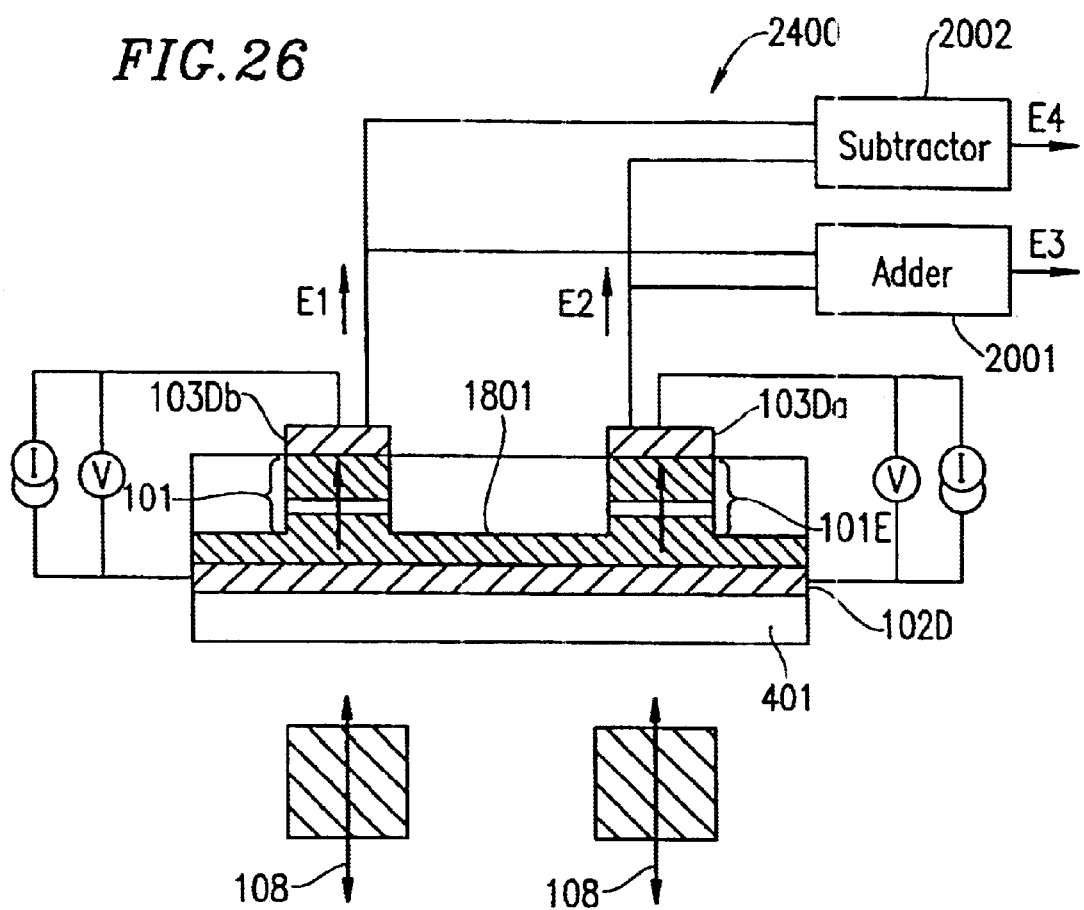

US 6,717,780 B2

MAGNETORESISTIVE DEVICE AND/OR MULTI-MAGNETORESISTIVE DEVICE

BACKGROUND OF THE INVENTION

1. Field of the Invention

The present invention relates to a magneto-resistive element widely used for, for example, a magnetic head for reproducing information recorded on a magnetic medium such as a magnetic disc, an optical magnetic disc, a magnetic tape or the like, for a magnetic sensor used in an automobile or the like, and a magnetic random access memory (MRAM).

2. Description of the Related Art

In accompaniment with recent improvement in the magnetic recording density, a spin valve type GMR (giant magneto-resistive) element has been put into practice. A spin valve type GMR is described as operating on a fundamental principle that a mean free path of electrons flowing in a layer along a direction parallel to a layer surface changes in accordance with a relative magnetization angle between a free layer and a fixed layer. A spin valve type GMR provides an MR ratio (magneto-resistive ratio) of about 10%, which is several times higher than that of a conventional anisotropic MR element.

As elements providing a still higher MR ratio than that of the spin valve type GMR, a TMR element using a TMR (tunneling magneto-resistive) effect and a CPP (current perpendicular to the plane) GMR element using a magnetic metal/transfer metal artificial lattice are now being studied.

A CPP GMR element basically operates on the same principle as that of the above-mentioned spin valve type GMR element. In the CPP GMR element, however, a current flows along a direction perpendicular to the layer surface. A TMR element is a new magneto-resistive element using a tunneling probability of electrons which changes in accordance with the relative magnetization angle between two ferromagnetic layer interposing a tunneling insulating layer, in the TMR element, a current flows in a direction perpendicular to the layer surface, like the above-mentioned CPP GMR element. In this specification, a TMR element and a CPP GMR element in which a current flows in a direction perpendicular to the layer surface will be collectively referred to as a "vertical current type magneto-resistive element".

Various structures for using a vertical current type magneto-resistive element for a magnetic head have been proposed. Japanese Laid-Open Publication No. 11-213349 proposes a shield type magnetic head including a TMR element, instead of a spin valve type GMR element, and including a flux guide. Japanese Laid-Open Publication No. 11-25425 proposes a magnetic head including a TMR element inside a yoke formed in a direction perpendicular to a surface of a magnetic recording medium.

When a TMR element is used for a magnetic head, there are problems that, due to an essentially high junction impedance of the TMR element, thermal noise is generated and the TMR element does not match an electric circuit for driving the TMR element.

An increase in the area of the TMR element in order to reduce the junction impedance causes another problem that it becomes difficult to reduce the size of the magnetic head. Such an increase in the area of the TMR element also causes a problem that it becomes difficult to improve the sensitivity of the magnetic head because a magnetic flux leaking from a surface of a magnetic recording medium increases as the recording density is improved.

A reduction in the thickness of the tunneling insulating layer of the TMR element in order to reduce the junction impedance also causes the following problem. Such a reduction strengthens the magnetic bonding between the ferromagnetic layers interposing the tunneling insulating layer. Therefore, it becomes difficult to realize an ideal relative magnetization angle, which makes it difficult to provide a high MR ratio.

A reduction in the distance between the TMR element and the magnetic recording medium in order to improve the sensitivity of the magnetic head causes a problem that a contact of the TMR element with the magnetic recording medium generates a thermal spike.

The above-mentioned conventional structures for using a vertical current type magneto-resistive element have problems of pulse amplitude asymmetry and asymmetry of side reading may undesirably occur.

A common problem among magnetic heads and MRAMs, the size of which is now being reduced, is that when the amount of a current flowing in the TMR element increases, a magnetic field generated based on the current causes an unfavorable influence on the magnetization direction of the free layer (or the magnetic field sensing section).

A TMR element has an inherent problem of bias voltage dependence such that when the bias voltage applied on the TMR element is increased, the MR ratio is decreased.

In order to apply a bias magnetic field on a vertical current type magneto-resistive element, it is necessary to provide an anti-ferromagnetic member for generating a bias magnetic field or it is necessary to provide a magnetic body forming the vertical current type magneto-resistive element with anisotropy by heat-treating the magnetic body in a magnetic field.

SUMMARY OF THE INVENTION

According to one aspect of the invention, a magneto-resistive element includes a vertical current type magneto-resistive element; a first conductor for causing a current to flow into the vertical current type magneto-resistive element; and a second conductor for causing the current to flow out of the vertical current type magneto-resistive element. The first conductor generates a first magnetic field based on the current. The second conductor generates a second magnetic field based on the current. The first conductor and the second conductor are located so that the first magnetic field and the second magnetic field act as a bias magnetic field applied on the vertical current type magneto-resistive element.

In one embodiment of the invention, the first conductor and the second conductor are located parallel to each other.

In one embodiment of the invention, the magneto-resistive element is substantially U-shaped.

In one embodiment of the inventions the first conductor and the second conductor are located twisted to each other.

According to another aspect of the invention, a magneto-resistive element includes a vertical current type magneto-resistive element; a first conductor for causing a current to flow into the vertical current type magneto-resistive element; and a second conductor for causing the current to flow out of the vertical current type magneto-resistive element. The first conductor generates a first magnetic field based on the current, the second conductor generates a second magnetic field based on the current. The first conductor and the second conductor are located so that the second magnetic field cancels at least a part of the first magnetic field.

In one embodiment of the invention, the first conductor and the second conductor are located parallel to each other.

According to still another aspect of the invention, a multiple element magneto-resistive device includes a first vertical current type magneto-resistive element responding to a specific external magnetic field; a second vertical current type magneto-resistive element responding to the specific external magnetic field; and a yoke on which the first vertical current type magneto-resistive element and the second vertical current type magneto-resistive element are provided.

In one embodiment of the invention, the multiple element magneto-resistive device further includes an adder for adding an output of the first vertical current type magneto-resistive element and an output of the second vertical current type magneto-resistive element so as to detect the specific external magnetic field.

In one embodiment of the invention, the multiple element magneto-resistive device further includes a subtracter for processing an output of the first vertical current type magneto-resistive element and an output of the second vertical current type magneto-resistive element with subtraction so as to detect the specific external magnetic field.

In one embodiment of the invention, each of the first vertical current type magneto-resistive element and the second vertical current type magneto-resistive element includes a fixed layer, a magnetization direction of which does not change even when a magnitude of the specific external magnetic field is changed, and a non-magnetic layer provided between the fixed layer and the yoke. The yoke acts as a free layer, a magnetization direction of which changes in accordance with a change in the magnitude of the specific external magnetic field.

According to still another aspect of the invention, a multiple element magneto-resistive device includes a first vertical current type magneto-resistive element responding to a specific external magnetic field; and a second vertical current type magneto-resistive element responding to the specific external magnetic field. The first vertical current type magneto-resistive element generates a first magnetic field based on a current therein. The second vertical current type magneto-resistive element generates a second magnetic field based on a current therein. The first vertical current type magneto-resistive element and the second vertical current type magneto-resistive element are located so that the first magnetic field and the second magnetic field act as a bias magnetic field applied on the multiple element magneto-resistive device.

In one embodiment of the invention, the first vertical current type magneto-resistive element and the second vertical current type magneto-resistive element are electrically connected to each other in series.

In one embodiment of the invention, the multiple element magneto-resistive device further includes a first conductor for causing the current to flow into the first vertical current type magneto-resistive element, a second conductor for causing the current flowing out of the first vertical current type magneto-resistive element to flow into the second vertical current type magneto-resistive element, and a third conductor for causing the current to flow out of the second vertical current type magneto-resistive element.

In one embodiment of the invention, the first vertical current type magneto-resistive element is located on the same side as the second vertical current type magneto-resistive element with respect to the second conductor.

In one embodiment of the invention, the first vertical current type magneto-resistive element is located on an opposite side to the second vertical current type magneto-resistive element with respect to the second conductor.

In one embodiment of the invention, the first vertical current type magneto-resistive element and the second vertical current type magneto-resistive element are electrically connected to each other in parallel.

In one embodiment of the invention, the multiple element magneto-resistive device further includes a first conductor for causing the current to flow into the first vertical current type magneto-resistive element and the second vertical current type magneto-resistive element, and a second conductor for causing the current to flow out of the first vertical current type magneto-resistive element and the second vertical current type magneto-resistive element.

In one embodiment of the invention, the multiple element magneto-resistive device further includes a first conductor for causing the current to flow into the first vertical current type magneto-resistive element, a second conductor for causing the current to flow out of the first vertical current type magneto-resistive element, a third conductor for causing the current to flow into the second vertical current type magneto-resistive element, and a fourth conductor for causing the current to flow out of the second vertical current type magneto-resistive element. The first conductor generates a first magnetic field based on the current flowing therein. The second conductor generates a second magnetic field based on the current flowing therein. The first conductor and the second conductor are located so that the first magnetic field and the second magnetic field act as a bias magnetic field applied on the first vertical current type magneto-resistive element. The third conductor generates a third magnetic field based on the current flowing therein. The fourth conductor generates a fourth magnetic field based on the current flowing therein. The third conductor and the fourth conductor are located so that the third magnetic field and the fourth magnetic field act as a bias magnetic field applied on the second vertical current type magneto-resistive element.

In one embodiment of the invention, the multiple element magneto-resistive device further includes a first conductor for causing the current to flow into the first vertical current type magneto-resistive element, a second conductor for causing the current to flow out of the first vertical current type magneto-resistive element, a third conductor for causing the current to flow into the second vertical current type magneto-resistive element, and a fourth conductor for causing the current to flow out of the second vertical current type magneto-resistive element. The first conductor generates a first magnetic field based on the current flowing therein. The second conductor generates a second magnetic field based on the current flowing therein. The first conductor and the second conductor are located so that the first magnetic field and the second magnetic field cancel each other. The third conductor generates a third magnetic field based on the current flowing therein. The fourth conductor generates a fourth magnetic field based on the current flowing therein. The third conductor and the fourth conductor are located so that the third magnetic field and the fourth magnetic field cancel each other.

In one embodiment of the invention, the multiple element magneto-resistive device further includes a yoke on which the first vertical current type magneto-resistive element and the second vertical current type magneto-resistive element are provided.

In one embodiment of the invention, the multiple element magneto-resistive device further includes a substrate provided on an opposite side to the first and second vertical current type magneto-resistive elements with respect to the yoke.

In one embodiment of the invention, the multiple element magneto-resistive device further includes a substrate provided on an opposite side to the yoke with respect to the first and second vertical current type magneto-resistive elements.

In one embodiment of the invention, the yoke is a horizontal yoke.

In one embodiment of the invention, the yoke is a vertical yoke.

In one embodiment of the invention, each of the first vertical current type magneto-resistive element and the second vertical current type magneto-resistive element includes an anti-ferromagnetic layer: a fixed layer; and a non-magnetic layer provided on an opposite side to the anti-ferromagnetic layer with respect to the fixed layer.

In one embodiment of the invention, the multiple element magneto-resistive device further includes an adder for adding an output of the first vertical current type magneto-resistive element and an output of the second vertical current type magneto-resistive element so as to detect the specific external magnetic field.

In one embodiment of the invention, the first vertical current type magneto-resistive element and the second vertical current type magneto-resistive element have different polarities from each other.

In one embodiment of the invention, the multiple element magneto-resistive device further includes a subtractor for processing an output of the first vertical current type magneto-resistive element and an output of the second vertical current type magneto-resistive element with subtraction so as to detect the specific external magnetic field.

In one embodiment of the invention, the first vertical current type magneto-resistive element and the second vertical current type magneto-resistive element have different polarities from each other.

In one embodiment of the invention, the first and second vertical current type magneto-resistive elements detect a change in a relative magnetization angle between at least two magnetic bodies as a change in a tunneling probability of electrons.

In one embodiment of the invention, the first and second vertical current type magneto-resistive elements detect a change in a relative magnetization angle between at least two magnetic bodies as a change in a mean free path of electrons.

According to still another aspect of the invention, a magnetic random access memory includes a multiple element magneto-resistive device. The multiple element magneto-resistive device includes a first vertical current type magneto-resistive element responding to a specific external magnetic field; and a second vertical current type magneto-resistive element responding to the specific external magnetic field. The first vertical current type magneto-resistive element generates a first magnetic field based on a current therein. The second vertical current type magneto-resistive element generates a second magnetic field based on a current therein. The first vertical current type magneto-resistive element and the second vertical current type magneto-resistive element are located so that the first magnetic field and the second magnetic field act as a bias magnetic field applied on the multiple element magneto-resistive device.

In one embodiment of the invention, the first vertical current type magneto-resistive element and the second vertical current type magneto-resistive element are electrically connected to each other in series.

In one embodiment of the invention, the magnetic random access memory further includes a first conductor for causing the current to flow into the first vertical current type magneto-resistive element, a second conductor for causing the current flowing out of the first vertical current type magneto-resistive element to flow into the second vertical current type magneto-resistive element, and a third conductor for causing the current to flow out of the second vertical current type magneto-resistive element.

In one embodiment of the invention, the first vertical current type magneto-resistive element is provided on an opposite side to the second vertical current type magneto-resistive element with respect to the second conductor.

Thus, the invention described herein makes possible the advantages of providing (1) a magneto-resistive element and a multiple element magneto-resistive device for adjusting a bias magnetic field applied on a vertical current type magneto-resistive element therein with a simple structure; (2) a magneto-resistive element and a multiple element magneto-resistive device having a high sensitivity; (3) a magneto-resistive element and a multiple element magneto-resistive device for reducing a thermal spike generated by the contact of a magnetic head and a magnetic recording medium; (4) a compact magneto-resistive element and a compact multiple element magneto-resistive device for providing a high output; and (5) a magneto-resistive element and a multiple element magneto-resistive device for preventing pulse amplitude asymmetry and asymmetric side reading.

These and other advantages of the present invention will become apparent to those skilled in the art upon reading and understanding the following detailed description with reference to the accompanying figures.

BRIEF DESCRIPTION OF THE DRAWINGS

FIG. 4 is a multiple element magneto-resistive device according to the first example of the present invention;

FIG. 5 is a plan view of the multiple element magneto-resistive device shown in FIG. 4 illustrating a bias magnetic field generated therein;

FIG. 6 is a cross-sectional view of another multiple element magneto-resistive device according to the first example of the present invention;

FIG. 22 shows a conventional magneto-resistive device;

FIG. 26 is a cross-sectional view illustrating how to connect the vertical current type magneto-resistive elements in the multiple element magneto-resistive device shown in FIG. 24;

DESCRIPTION OF THE PREFERRED EMBODIMENTS

Hereinafter, the present invention will be described by way of illustrative examples with reference to the accompanying drawings.

EXAMPLE 1

Figure 1A:
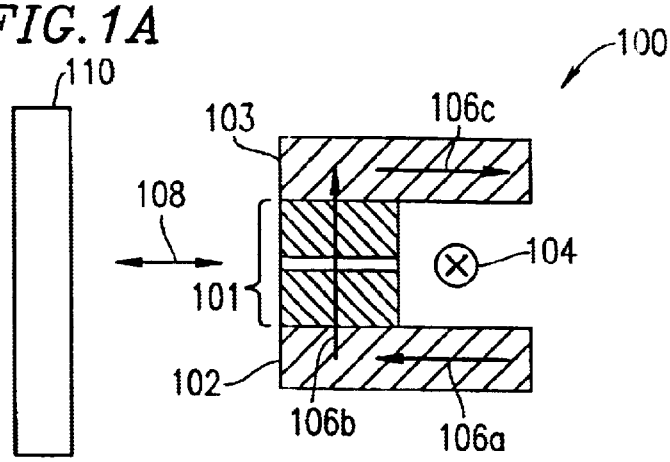
FIG. 1A is a cross-sectional view of a magneto-resistive element according to a first example of the present invention.

FIG. 1A is a cross-sectional view of a magneto-resistive element 100 according to a first example of the present invention. The magneto-resistive element 100 is usable for, for example, a magnetic head for reproducing information recorded on a magnetic disc or the like. The magneto-resistive element 100 includes a vertical current type magneto-resistive element 101. The vertical current type magneto-resistive element 101 is, for example, a TMR element. The vertical current type magneto-resistive element 101 may be a CPP GMR element.

The vertical current type magneto-resistive element 101 includes a plurality of laminated layers. The vertical current type magneto-resistive element 101 responds to an external magnetic field 108, for example, a component of a magnetic field leaking from a surface of a magnetic recording medium 110 (such as a magnetic disc or the like), the component being parallel to the plurality of layers. One surface of the vertical current type magneto-resistive element 101 has a conductor 102 provided thereon. The conductor 102 extends along the surface of the vertical current type magneto-resistive element 101 toward the right of the sheet of paper of FIG. 1A in a direction parallel to the external magnetic field 108. Another surface of the vertical current type magneto-resistive element 101 has a conductor 103 provided thereon, so that the conductor 103 faces the conductor 102. The conductor 103 is parallel to the conductor 102. Thus, the magneto-resistive element 100, including the conductors 102 and 103 and the vertical current type magneto-resistive element 101, is substantially U-shaped.

Hereinafter, a bias magnetic field applied on the vertical current type magneto-resistive element 101 will be described.

Figure 1B:
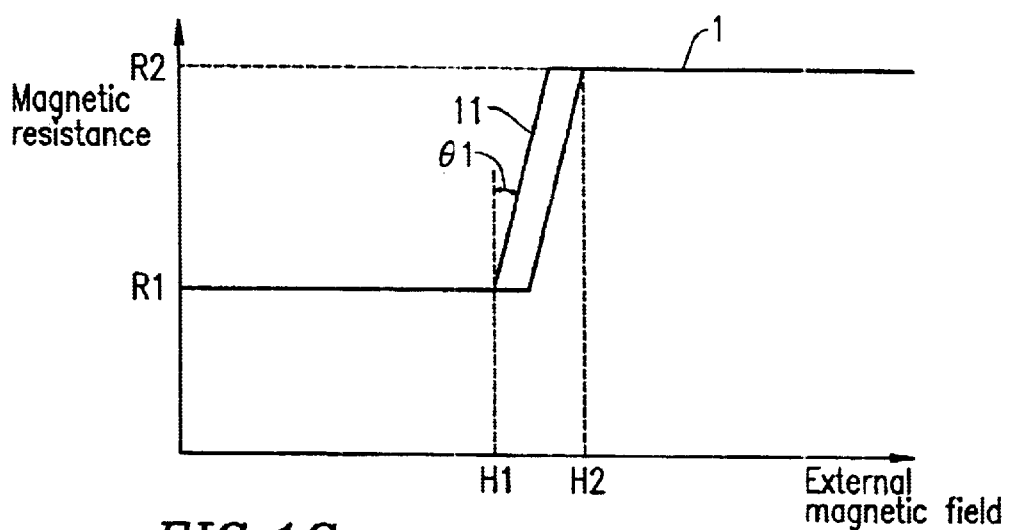
FIG. 1B is a graph illustrating an MR-H curve of a vertical current type magneto-resistive element in the state where no bias magnetic field acts thereon.
Figure 1C:
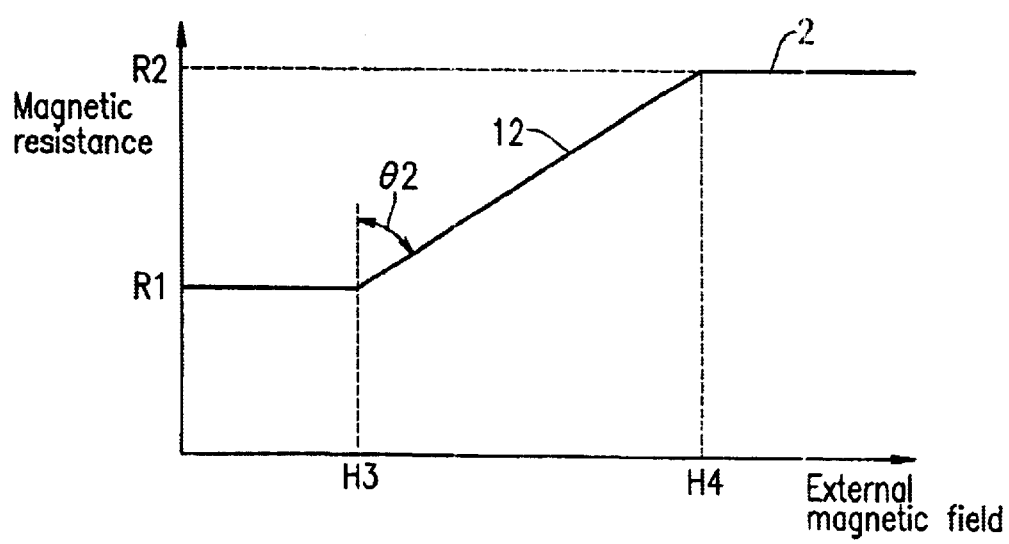
FIG. 1C is a graph illustrating an MR-H curve of the vertical current type magneto-resistive element in the state where a bias magnetic field acts thereon.

The bias magnetic field acts on the vertical current type magneto-resistive element 101 in a direction substantially vertical to the external magnetic field 108. FIG. 1B is a graph illustrating an MR-H curve of the vertical current type magneto-resistive element 101 in the state where the bias magnetic field does not act. FIG. 1C is a graph illustrating an MR-H curve of the vertical current type magneto-resistive element 101 in the state where the bias magnetic field acts. In FIGS. 1B and 1C, the horizontal axis represents the magnitude of the external magnetic field (H) to be detected by the vertical current type magneto-resistive element 101, and the vertical axis represents the magnitude of the magnetic resistance of the vertical current type magneto-resistive element 101.

Referring to FIG. 1B, in the state where the bias magnetic field does not act on the vertical current type magneto-resistive element 101, the vertical current type magneto-resistive element 101 shows MR-H curve 1. MR-H curve 1 forms a hysteresis 11 in the range of external magnetic field magnitude H1 to external magnetic field H2. When the magnitude of the external magnetic field 108 is smaller than the external magnetic field magnitude H1, the vertical current type magneto-resistive element 101 has magnetic resistance R1. When the magnitude of the external magnetic field 108 is larger than the external magnetic field magnitude H2, the vertical current type magneto-resistive element 101 has magnetic resistance R2, which is larger than the magnetic resistance R1.

Referring to FIG. 1C, in the state where the bias magnetic field acts on the vertical current type magneto-resistive element 108 in a direction substantially vertical to the external magnetic field 108, the vertical current type magneto-resistive element 101 shows MR-H curve 2. MR-H curve 2 has a smaller hysteresis than MR-H curve 1. An inclination angle 62 of MR-H curve 2 with respect to the vertical axis is larger than an inclination angle 61 of MR-H curve 1 with respect to the vertical axis. As a result, the vertical current type magneto-resistive element 101 can exhibit an MR-H curve 2, which has a smaller hysteresis than the MR-H curve 1 and is linear in the range of external magnetic field H3 to external magnetic field H4, which is larger than the range of H1 to H2 shown in FIG. 1B. When the magnitude of the external magnetic field 108 is smaller than the external magnetic field magnitude H3, the vertical current type magneto-resistive element 101 has magnetic resistance R1. When the magnitude of the external magnetic field 108 is larger than the external magnetic field magnitude H4, the vertical current type magneto-resistive element 101 has magnetic resistance R2, which is larger than the magnetic resistance R1.

The magneto-resistive element 100 having such a structure operates in the following manner.

Referring to FIG. 1A again, a current flows in the conductor 102 in a direction of arrow 106a, and flows into the vertical current type magneto-resistive element 101 from one surface thereof. Then, the current flows in a direction of arrow 106b, which is perpendicular to a surface of the plurality of layers included in the vertical current type magneto-resistive element 101. The current flows out of the vertical current type magneto-resistive element 101 from the other surface thereof and flows in the conductor 103 in a direction of arrow 106c opposite to that in the conductor 102.

Based on the current flowing in the conductor 102 in the direction of arrow 106a, the conductor 102 generates a first magnetic field. Based on the current flowing in the conductor 103 in the direction of arrow 106c opposite to that in the conductor 102, the conductor 103 generates a second magnetic field. A synthetic magnetic field 104 obtained by synthesizing the first and second magnetic fields acts in a direction perpendicular to the sheet of paper of FIG. 1A from the front surface of the paper to the rear surface of the paper. Accordingly, the synthetic magnetic field 104 acts on the vertical current type magneto-resistive element 101 in a direction substantially perpendicular to the external magnetic field 108. Thus, the synthetic magnetic field 104 acts as a bias magnetic field on the vertical current type magneto-resistive element 101.

As described above, the magneto-resistive element 100 according to the first example includes the conductors 102 and 103, which are located so that the synthetic magnetic field 104, obtained by synthesizing the first magnetic field generated based on the current flowing in the conductor 102 and the second magnetic field generated based on the current flowing in the conductor 103, is substantially perpendicular to the external magnetic field 108. The synthetic magnetic field 104 acts as a bias magnetic field on the vertical current type magneto-resistive element 101. Therefore, unlike the conventional art, it is not necessary to provide an anti-ferromagnetic member for generating a bias magnetic field or it is not necessary to provide a magnetic body forming the vertical current type magneto-resistive element 101 with anisotropy by heat-treating the magnetic body in a magnetic field. As a result, a bias magnetic field can be caused to act on the vertical current type magneto-resistive element 101 by a simpler structure than in the conventional art.

A structure for providing an anti-ferromagnetic member for generating a bias magnetic field and/or a structure for providing a magnetic body forming the vertical current type magneto-resistive element 101 with anisotropy by heat-treating the magnetic body in a magnetic field may be combined with the structure of the first example. By such a combination, the vertical current type magneto-resistive element 101 of the magneto-resistive element 100 can have a more satisfactory MR-H curve.

A bias magnetic field applied on the vertical current type magneto-resistive element 101 may be generated by a current which is separate from the current flowing in the vertical current type magneto-resistive element 101. In this case, the bias magnetic field can be provided stably regardless of the magnitude of the vertical current type magneto-resistive element 101.

Figure 2:
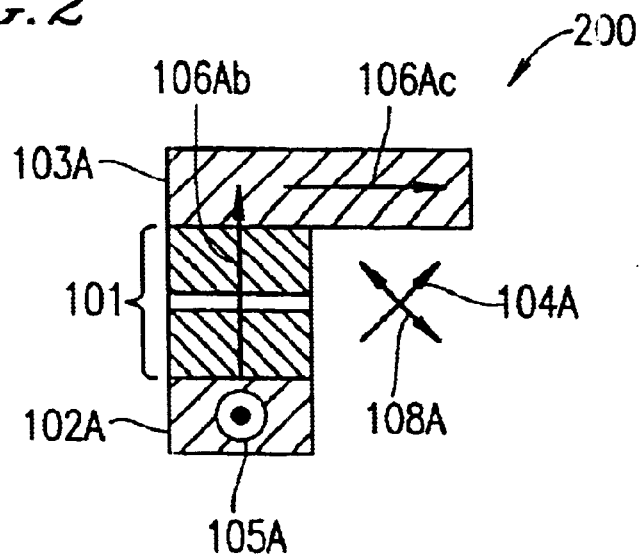
FIG. 2 is a cross-sectional view of another magneto-resistive element according to the first example of the present invention.

FIG. 2 is a cross-sectional view of another magneto-resistive element 200 according to the first example of the present invention. Identical elements as those described above with reference to FIG. 1A will bear identical reference numerals and detailed descriptions thereof will be omitted. The magneto-resistive element 200 includes a vertical current type magneto-resistive element 101. The vertical current type magneto-resistive element 101 includes a plurality of laminated layers. A surface of the plurality of laminated layers is inclined substantially at 45 degrees with respect to an external magnetic field 108. One surface of the vertical current type magneto-resistive element 101 has a conductor 102A provided thereon. The conductor 102A extends along the surface of the vertical current type magneto-resistive element 101 in a direction perpendicular to the sheet of paper of FIG. 2 from the front Surface of the paper to the rear surface of the paper. Another surface of the vertical current type magneto-resistive element 101 has a conductor 103A provided thereon. The conductor 103A extends along the surface of the vertical current type magneto-resistive element 101 toward the right of the sheet of paper of FIG. 2. Thus, the conductors 102A and 103A are located so as to be twisted to each other.

The magneto-resistive element 200 having such a structure operates in the following manner.

A current flows in the conductor 102A in a direction perpendicular to the sheet of paper of FIG. 2A from the rear surface of the paper to the front surface of the paper, and flows into the vertical current type magneto-resistive element 101 from one surface thereof. Then, the current flows in a direction of arrow 106Ab, which is perpendicular to a surface of the plurality of layers included in the vertical current type magneto-resistive element 101. The current flows out of the vertical current type magneto-resistive element 101 from the other surface thereof and flows in the conductor 103A in a direction of arrow 106Ac.

Based on the current flowing in the conductor 102A, the conductor 102A generates a third magnetic field. Based on the current flowing in the conductor 103A, the conductor 103A generates a fourth magnetic field. A synthetic magnetic field 104A obtained by synthesizing the third and fourth magnetic fields acts in a direction inclined at substantially 45 degrees with respect to the conductors 102A and 103A as shown in FIG. 2. Accordingly, the synthetic magnetic field 104A acts on the vertical current type magneto-resistive element 101 in a direction substantially perpendicular to the external magnetic field 108A. Thus, the synthetic magnetic field 104A acts as a bias magnetic field on the vertical current type magneto-resistive element 101.

As described above, the magneto-resistive element 200 according to the first example includes the conductors 102A and 103A, which are located so that the synthetic magnetic field 104A obtained by synthesizing the third magnetic field generated based on the current flowing in the conductor 102A and the fourth magnetic field generated based on the current flowing in the conductor 103A is substantially perpendicular to the external magnetic field 108A. The synthetic magnetic field 104A acts as a bias magnetic field on the vertical current type magneto-resistive element 101. Therefore, an effect similar to that described above with reference to FIG. 1A is provided.

Figure 3:
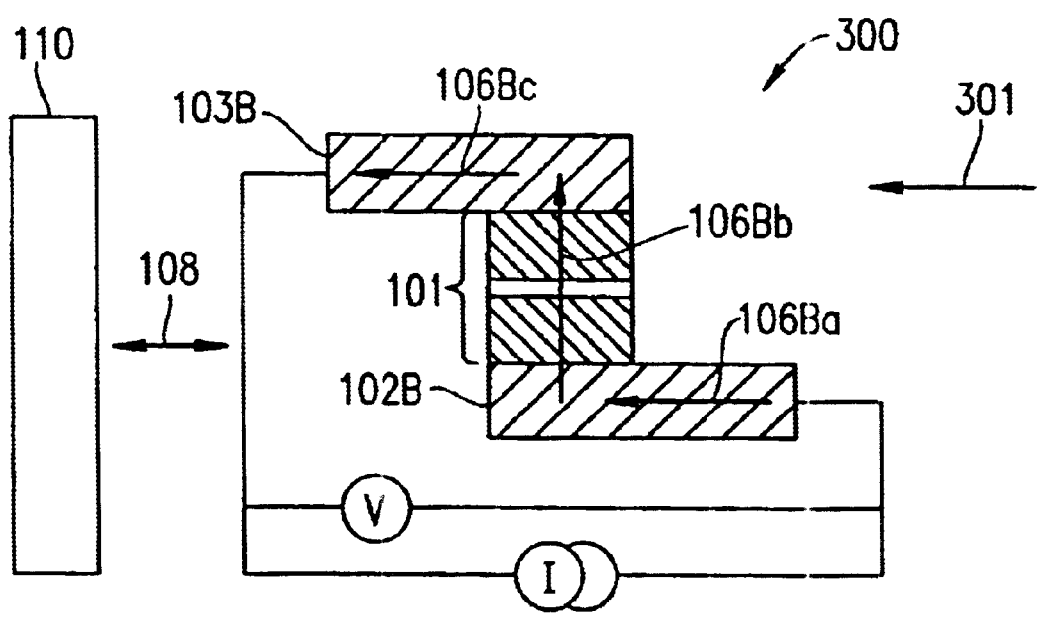
FIG. 3 is a cross-sectional view of still another magneto-resistive element according to the first example of the present invention.

FIG. 3 is a cross-sectional view of still another magneto-resistive element 300 according to the first example of the present invention. Identical elements as those described above with reference to FIG. 1A will bear identical reference numerals and detailed descriptions thereof will be omitted.

The magneto-resistive element 300 solves the following problems. The magneto-resistive element 100 described above with reference to FIG. 1A has the following problem. When the amount of current flowing in the vertical current type magneto-resistive element 101 in order to improve the output to deal with the reduction of size of a magnetic head, and as a result, the synthetic magnetic field 104 generated is excessively large compared to the external magnetic field 108, a change in the level of the magnetic resistance of the vertical current type magneto-resistive element 101 with respect to the change in the magnitude of the external magnetic field 108 is decreased. Similarly, the magneto-resistive element 200 described above with reference to FIG. 2 has the problem that when the synthetic magnetic field 104A generated is excessively large compared to the external magnetic field 108A, a change in the level of the vertical current type magnetic resistance of the magneto-resistive element 101 with respect to the change in the magnitude of the external magnetic field 108 is decreased.

Referring to FIG. 3, the magneto-resistive element 300 includes a vertical current type magneto-resistive element 101. The vertical current type magneto-resistive element 101 includes a plurality of laminated layers. A surface of the plurality of laminated layers is parallel to an external magnetic field 108. One surface of the vertical current type magneto-resistive element 101 has a conductor 102B provided thereon. The conductor 102B extends along the surface of the vertical current type magneto-resistive element 101 toward the right of the sheet of paper of FIG. 3 in a direction parallel to the external magnetic field 108. Another surface of the vertical current type magneto-resistive element 101 has a conductor 103B provided thereon. The conductor 103B extends along the other surface of the vertical current type magneto-resistive element 101 oppositely to the conductor 102B in a direction parallel to the external magnetic field 108. Thus, the conductor 103B is parallel to the conductor 102B.

The magneto-resistive element 300 having such a structure operates in the following manner.

A current flows in the conductor 102B in a direction of arrow 106Ba, and flows into the vertical current type magneto-resistive element 101 from one surface thereof. Then, the current flows in a direction of arrow 106Bb, which is perpendicular to a surface of the plurality of layers included in the vertical current type magneto-resistive element 101. The current flows out of the vertical current type magneto-resistive element 101 from the other surface thereof and flows in the conductor 103B in a direction of arrow 106Bc. Thus, the current flows in the same direction in the conductor 102B and in the conductor 103B.

Based on the current flowing in the conductor 102B, the conductor 102B generates a fifth magnetic field. Based on the current flowing in the conductor 103B, the conductor 103B generates a sixth magnetic field. Since the current flows in the same direction in the conductor 102B as in the conductor 103B, the sixth magnetic field generated based on the current flowing in the conductor 103B cancels the fifth magnetic field generated based on the current flowing in the conductor 102B.

As described above, the magneto-resistive element 300 according to the first example includes the conductors 102B and 103B, which are located so that the sixth magnetic field generated based on the current flowing in the conductor 103B cancels the fifth magnetic field generated based on the current flowing in the conductor 102B. Therefore, the magnitude of a synthetic magnetic field of the fifth magnetic field and the sixth magnetic field is zero. Thus, the synthetic magnetic field does not exceed the external magnetic field 108. As a result, even when the amount of current flowing in the vertical current type magneto-resistive element 101 is increased, the change in the level of the magnetic resistance of the vertical current type magneto-resistive element 101 with respect to the change in the magnitude of the external magnetic field 108 is not decreased.

The sixth magnetic field generated based on the current flowing in the conductor 103B need not cancel the entirety of the fifth magnetic field generated based on the current flowing in the conductor 102B but may cancel a part of the fifth magnetic field. When, for example, the magneto-resistive element 300 is used for a magnetic head, the sixth magnetic field may cancel the fifth magnetic field so that the synthetic magnetic field of the fifth and sixth magnetic fields does not exceed the external magnetic field 108. According to the present invention, the sixth magnetic field cancels at least a part of the fifth magnetic field so that the synthetic magnetic field of the fifth and sixth magnetic fields does not exceed the external magnetic field 108.

When the magnitude of the synthetic magnetic field becomes zero as a result of the sixth magnetic field canceling the fifth magnetic field, no bias magnetic field acting on the vertical current type magneto-resistive element 101 can be provided by the current flowing in the conductors 102B and 103B. When the magnitude of the synthetic magnetic field becomes excessively small as a result of the sixth magnetic field canceling a part of the fifth magnetic field, a bias magnetic field having a sufficient magnitude may not be provided.

In this case, a bias magnetic field to be applied on the vertical current type magneto-resistive element 101 may be generated by a current which is separate from the current flowing in the conductors 102B and 103B. Alternatively, the bias magnetic field to be applied on the vertical current type magneto-resistive element 101 may be generated by providing the magnetic body of the vertical current type magneto-resistive element 101 with anisotropy by heat treatment or by additionally providing an anti-ferromagnetic member or the like to the magneto-resistive element 300.

When the magneto-resistive element 300 is used for an MRAM, an MR-H curve having a satisfactory rectangular shape without any extra bias magnetic field or shift magnetic field is provided by canceling a magnetic field generated based on a current. The magnetic field generated based on the current may be partially cancelled, instead of cancelled entirely. In this case, the partially cancelled magnetic field can be used to counteract a bias magnetic field or shift magnetic field generated by a different factor or used as a bias magnetic field for writing.

One of the structures shown in FIGS. 1A, 2 and 3 is preferably selected based on the magnitude of the current to be supplied to the vertical current type magneto-resistive element 101 and the external magnetic field. When, for example, the magneto-resistive element is used for a magnetic head and the magnitude of the synthetic magnetic field generated is smaller than the external magnetic field, the magneto-resistive element 100 (FIG. 1A) or 200 (FIG. 2) is preferably selected. The reason is because these magneto-resistive elements can cause a bias magnetic field to act on the vertical current type magneto-resistive element 101 by a simple structure. When the amount of the current to be supplied to the vertical current type magneto-resistive element 101 is increased in order to improve the output to deal with the reduction of size of a magnetic head, and as a result, the synthetic magnetic field generated is excessively large compared to the external magnetic field, the magneto-resistive element 300 (FIG. 3) is preferably selected. The reason is because the magneto-resistive element 300 can provide a high output while preventing a change in the level of the magnetic resistance from decreasing with respect to the change in the magnitude of the external magnetic field 108.

FIG. 4 is a cross-sectional view of a multiple element magneto-resistive device 400 according to the first example, and FIG. 5 is a plan view of the multiple element magneto-resistive device 400. Identical elements as those described above with reference to FIG. 3 will bear identical reference numerals and detailed descriptions thereof will be omitted.

The multiple element magneto-resistive device 400 includes a substrate 401 having a surface parallel to an external magnetic field 108. The surface of the substrate 401 has two magneto-resistive elements 300 described above with reference to FIG. 3 provided thereon. The magneto-resistive elements 300 are arranged in a direction parallel to the external magnetic field 108. In FIG. 4, the magneto-resistive elements 300 are shown as seen in the direction of arrow 301 in FIG. 3. The magneto-resistive elements 300 both extend in a direction perpendicular to the external magnetic field 108. Here, the magneto-resistive element 300 shown on the right is represented by reference numeral 300A, and the vertical current type magneto-resistive element 101 is represented by reference numeral 101A for the sake of clarity. Similarly, the magneto-resistive element 300 shown on the left is represented by reference numeral 300B, and the vertical current type magneto-resistive element 101 is represented by reference numeral 101B for the sake of clarity.

With reference to FIGS. 3, 4 and 5, the multiple element magneto-resistive device 400 operates in the following manner.

In the magneto-resistive element 300A, a current f lows in the conductor 102B in a direction of arrow 106Ba, and flows into the vertical current type magneto-resistive element 101A from one surface thereof on the side of the substrate 401. Then, the current flows away from the substrate 401 in a direction of arrow 106Bb, which is perpendicular to a surface of the plurality of layers included in the vertical current type magneto-resistive element 101A. The current flows out of the vertical current type magneto-resistive element 101A from the other surface thereof and flows in the conductor 103B in a direction of arrow 106Ba.

As shown in FIG. 5, based on the current flowing in the vertical current type magneto-resistive element 101A, the vertical current type magneto-resistive element 101A generates a bias magnetic field 604B. The bias magnetic field 604B acts on the vertical current type magneto-resistive element 101B of the magneto-resistive element 300B in a direction substantially perpendicular to the external magnetic field 108. Thus, the bias magnetic field 604B acts as a bias magnetic field acting on the vertical current type magneto-resistive element 101B of the magneto-resistive element 300B.

In the multiple element magneto-resistive element 300B also, a current flows in the conductor 102B in a direction of arrow 106Ba, and flows into the vertical current type magneto-resistive element 101B from one surface thereof on the side of the substrate 401. Then, the current flows away from the substrate 401 in a direction of arrow 106Bb, which is perpendicular to a surface of the plurality of layers included in the vertical current type magneto-resistive element 101B. The current flows out of the vertical current type magneto-resistive element 101B from the other surface thereof and flows in the conductor 103B in a direction of arrow 106Bc.

As shown in FIG. 5, based on the current flowing in the vertical current type magneto-resistive element 101B, the vertical current type magneto-resistive element 101B generates a bias magnetic field 604A. The bias magnetic field 604A acts on the vertical current type magneto-resistive element 101A of the magneto-resistive element 300A in a direction substantially perpendicular to the external magnetic field 108. Thus, the bias magnetic field 604A acts as a bias magnetic field acting on the vertical current type magneto-resistive element 101A of the magneto-resistive element 300A.

As described above, in the multiple element magneto-resistive device 400, the two bias magnetic fields 604A and 604B act on the vertical current type magneto-resistive elements 101A and 101B, respectively. Such a structure improves the linearity of a magnetic response of each vertical current type magneto-resistive element 101A, 101B to the external magnetic field 108, as compared to the case where one bias magnetic field acts on two vertical current type magneto-resistive elements 101.

FIG. 6 is a cross-sectional view of another multiple element magneto-resistive device 500 according to the first example. Identical elements as those described above with reference to FIG. 4 will bear identical reference numerals and detailed descriptions thereof will be omitted.

The multiple element magneto-resistive device 500 includes a substrate 401 having a surface parallel to an external magnetic field 105. The surface of the substrate 401 has a conductor 102C extending in a direction parallel to the external magnetic field 108. Two vertical current type magneto-resistive elements 101 are arranged on the conductor 102C in a direction parallel to the external magnetic field 108. A conductor 103C commonly connected to both of the two vertical current type magneto-resistive elements 101 is provided thereon. The conductor 103C extends in a direction parallel to the external magnetic field 108. Thus, the two vertical current type magneto-resistive elements 101 are connected in parallel by the conductors 102C and 103C. The conductors 102C and 103C are formed of a magnetic conductive layer or a non-magnetic conductive layer. Here, the vertical current type magneto-resistive element 101 shown on the right in FIG. 6 is represented by reference numeral 101A and the vertical current type magneto-resistive element 101 shown on the left in FIG. 6 is represented by reference numeral 101B for the sake of clarity.

The multiple element magneto-resistive device 500 having such a structure operates in the following manner.

Toward the vertical current type magneto-resistive element 101A, a current flows in the conductor 102C in a direction of arrow 106Ca, and flows into the vertical current type magneto-resistive element 101A from one surface thereof on the side of the substrate 401. Then, the current flows away from the substrate 401 in a direction of arrow 106Cb, which is perpendicular to a surface of the plurality of layers included in the vertical current type magneto-resistive element 101B. The current flows out of the vertical current type magneto-resistive element 101A from the other surface thereof and flows in the conductor 103C in a direction of arrow 106Cc.

Toward the vertical current type magneto-resistive element 101B, a current flows in the conductor 102C in a direction of arrow 106Ca, and flows into the vertical current type magneto-resistive element 101B from one surface thereof on the side of the substrate 401. Then, the current flows away from the substrate 401 in a direction of arrow 106Cb, which is perpendicular to a surface of the plurality of layers included in the vertical current type magneto-resistive element 101B. The current flows out of the vertical current type magneto-resistive element 101B from the other surface thereof and flows in the conductor 103C in a direction of arrow 106Cc.

As shown in FIG. 5, based on the current flowing in the vertical current type magneto-resistive element 101A, the vertical current type magneto-resistive element 101A generates a bias magnetic field 604B. The bias magnetic field 604B acts on the vertical current type magneto-resistive element 101B in a direction substantially perpendicular to the external magnetic field 108. Thus, the bias magnetic field 604B acts as a bias magnetic field acting on the vertical current type magneto-resistive element 101B.

As shown in FIG. 5, based on the current flowing in the vertical current type magneto-resistive element 101B, the vertical current type magneto-resistive element 101B generates a bias magnetic field 604A. The bias magnetic field 604A acts on the vertical current type magneto-resistive element 101A in a direction substantially perpendicular to the external magnetic field 108. Thus, the bias magnetic field 604A acts as a bias magnetic field acting on the vertical current type magneto-resistive element 101A.

As described above, in the multiple element magneto-resistive device 500, the two bias magnetic fields 604A and 604B act on the vertical current type magneto-resistive elements 101A and 101B, respectively, like the multiple element magneto-resistive device 400 (FIG. 4). Such a structure improves the linearity of a magnetic response of each vertical current type magneto-resistive element 101 to the external magnetic field 108, as compared to the case where one bias magnetic field acts on two vertical current type magneto-resistive elements 101.

Figure 7:
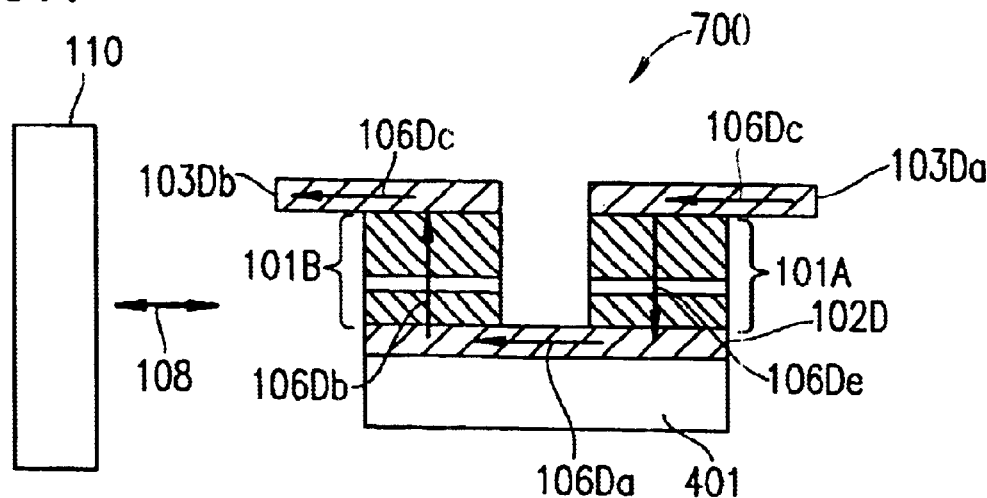
FIG. 7 is a cross-sectional view of a multiple element magneto-resistive device according to the first example of the present invention in which vertical current type magneto-resistive elements are connected in series.
Figure 8:
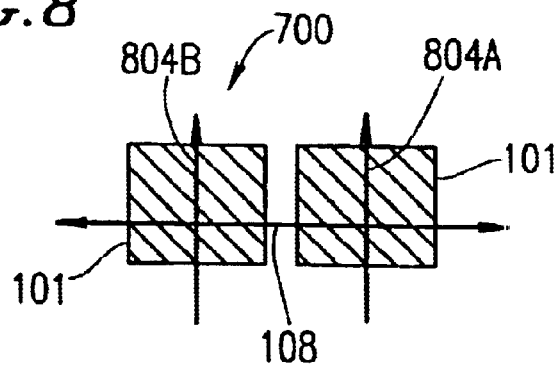
FIG. 8 is a plan view of the multiple element magneto-resistive device shown in FIG. 7 illustrating a bias magnetic field generated therein.

FIG. 7 is a cross-sectional view of a multiple element magneto-resistive device 700 according to the first example including vertical current type magneto-resistive elements 101 connected in series. FIG. 8 is a plan view of the multiple element magneto-resistive device 700. Identical elements as those described above with reference to FIG. 4 will bear identical reference numerals and detailed descriptions thereof will be omitted. Here, the vertical current type magneto-resistive element 101 shown on the right in FIG. 7 is represented by reference numeral 101A and the vertical current type magneto-resistive element 101 shown on the right in FIG. 7 is represented by reference numeral 101B for the sake of clarity.

The multiple element magneto-resistive device 700 includes a substrate 401 having a surface parallel to an external magnetic field 108. The surface of the substrate 401 has a conductor 102D extending in a direction parallel to the external magnetic field 108. Two vertical current type magneto-resistive elements 101A and 101B are arranged on the conductor 102D in a direction parallel to the external magnetic field 108. On the vertical current type magneto-resistive element 101A, a conductor 103Da extends in a direction parallel to the external magnetic field 108, away from the vertical current type magneto-resistive element 101B. On the vertical current type magneto-resistive element 101B, a conductor 103Db extends in a direction parallel to the external magnetic field 108, away from the vertical current type magneto-resistive element 101A. Thus, the vertical current type magneto-resistive elements 101A and 101B are connected in series by the conductors 102D, 103Da and 103Db. The conductors 102D, 103Da and 103Db are formed of a magnetic conductive layer or a non-magnetic conductive layer.

The multiple element magneto-resistive device 700 having such a structure operates in the following manner.

Toward the vertical current type magneto-resistive element 101A, a current flows in the conductor 103Da in a direction of arrow 106Dc, and flows into the vertical current type magneto-resistive element 101A from the surface thereof on the opposite side to the substrate 401. Then, the current flows toward the substrate 401 in a direction of arrow 106De, which is perpendicular to a surface of the plurality of layers included in the vertical current type magneto-resistive element 101A. The current flows out of the vertical current type magneto-resistive element 101A from the surface thereof on the side of the substrate 401 and flows in the conductor 102D in a direction of arrow 106Da.

Toward the vertical current type magneto-resistive element 101B, a current flows in the conductor 102D in a direction of arrow 106Da, and flows into the vertical current type magneto-resistive element 101B from one surface thereof on the side of the substrate 401. Then, the current flows in a direction of arrow 106Db away from the substrate 401, which is perpendicular to a surface of the plurality of layers included in the vertical current type magneto-resistive element 101B. The current flows out of the vertical current type magneto-resistive element 101B from the other surface thereof and flows in the conductor 103Db in a direction of arrow 106Dc.

As shown in FIG. 8, based on the current flowing in the vertical current type magneto-resistive element 101A, the vertical current type magneto-resistive element 101A generates a bias magnetic field 804B. The bias magnetic field 804B acts on the vertical current type magneto-resistive element 101B in a direction substantially perpendicular to the external magnetic field 108. Thus, the bias magnetic field 804B acts as a bias magnetic field acting on the vertical current type magneto-resistive element 101B.

As shown in FIG. 8, based on the current flowing in the vertical current type magneto-resistive element 101B, the vertical current type magneto-resistive element 101B generates a bias magnetic field 804A. The bias magnetic field 804A acts on the vertical current type magneto-resistive element 101A in a direction substantially perpendicular to the external magnetic field 108. Thus, the bias magnetic field 804A acts as a bias magnetic field acting on the vertical current type magneto-resistive element 101A.

As described above, in the multiple element magneto-resistive device 700, the two bias magnetic fields 804A and 804B act on the vertical current type magneto-resistive elements 101A and 101B, respectively, like the multiple element magneto-resistive device 400 (FIG. 4). Such a structure improves the linearity of a magnetic response of each vertical current type magneto-resistive element 101 to the external magnetic field 108, as compared to the case where one bias magnetic field acts on two vertical current type magneto-resistive elements 101.

Figure 9:
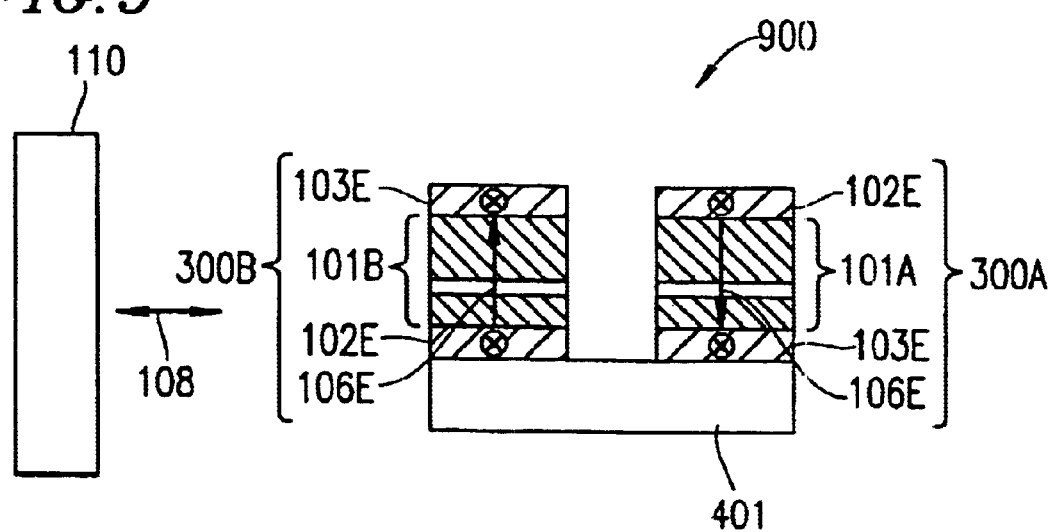
FIG. 9 is a cross-sectional view of still another multiple element magneto-resistive device according to the first example of the present invention.

FIG. 9 is a cross-sectional view of a multiple element magneto-resistive device 900 according to the first example. Identical elements as those described above with reference to FIG. 4 will bear identical reference numerals and detailed descriptions thereof will be omitted.

Unlike the multiple element magneto-resistive device 400, in the multiple element magneto-resistive device 900, the magneto-resistive element 300A is located upside down so that a current flows from a conductor 102E toward a conductor 103E provided on the substrate 401 in a direction of arrow 106E. Here also, the magneto-resistive element 300 shown on the right is represented by reference numeral 300A, and the vertical current type magneto-resistive element 101 is represented by reference numeral 101A for the sake of clarity. Similarly, the magneto-resistive element 300 shown on the left is represented by reference numeral 300B, and the vertical current type magneto-resistive element 101 is represented by reference numeral 101B for the sake of clarity.

Like the multiple element magneto-resistive device 700 (FIG. 7), as shown in FIG. 8, based on the current flowing in the vertical current type magneto-resistive element 101A, the vertical current type magneto-resistive element 101A generates a bias magnetic field 804B. The bias magnetic field 804B acts on the vertical current type magneto-resistive element 101B in a direction substantially perpendicular to the external magnetic field 108. Thus, the bias magnetic field 804B acts as a bias magnetic field acting on the vertical current type magneto-resistive element 101B.

As shown in FIG. 8, based on the current flowing in the vertical current type magneto-resistive element 101B, the vertical current type magneto-resistive element 101B generates a bias magnetic field 804A. The bias magnetic field 804A acts on the vertical current type magneto-resistive element 101A in a direction substantially perpendicular to the external magnetic field 108. Thus, the bias magnetic field 804A acts as a bias magnetic field acting on the vertical current type magneto-resistive element 101A.

As described above, in the multiple element magneto-resistive device 900, the two bias magnetic fields 804A and 804B act on the vertical current type magneto-resistive elements 101A and 101B, respectively, like the multiple element magneto-resistive device 700 (FIG. 7). Such a structure improves the linearity of a magnetic response of each vertical current type magneto-resistive element 101 to the external magnetic field 108, as compared to the case where one bias magnetic field acts on two vertical current type magneto-resistive elements 101.

Figure 10:
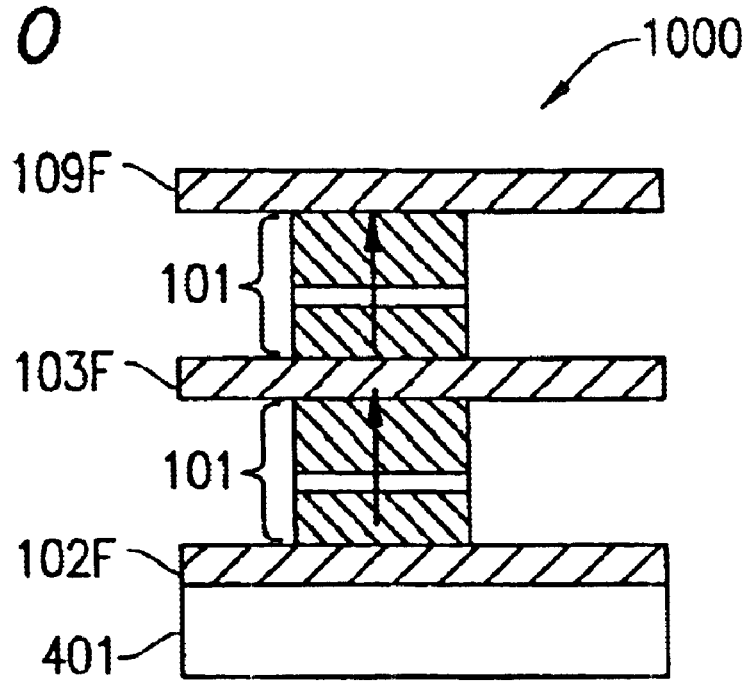
FIG. 10 is a cross-sectional view of still another multiple element magneto-resistive device according to the first example of the present invention in which vertical current type magneto-resistive elements are connected in series.

FIG. 10 is a cross-sectional view of still another multiple element magneto-resistive device 1000 according to the first example including vertical current type magneto-resistive elements 101 connected in series. Identical elements as those described above with reference to FIG. 4 will bear identical reference numerals and detailed descriptions thereof will be omitted.

The multiple element magneto-resistive device 1000 includes a substrate 401, a conductor 102F provided on the substrate 401, a vertical current type magneto-resistive element 101 provided on the conductor 102F, a conductor 103F provided on the vertical current type magneto-resistive element 101, a vertical current type magneto-resistive element 101 provided on the conductor 103F, and a conductor 109F provided on the vertical current type magneto-resistive element 101. The two vertical current type magneto-resistive elements 101 are located symmetrically with respect to the conductor 103F. Namely, one of the vertical current type magneto-resistive elements is located on an opposite side to the other vertical current type magneto-resistive element with respect to the conductor 103F. Thus, the two vertical current type magneto-resistive elements 101 are connected in series by the conductors 102F, 103F and 109F. The conductors 102F, 103F and 109F are formed of a magnetic conductive layer or a non-magnetic conductive layer.

In the case where a TMR element is used as each of the vertical current type magneto-resistive elements 101, the bias voltage is divided for the two vertical current type magneto-resistive elements 101 since the vertical current type magneto-resistive elements 101 are electrically connected in series. Therefore, the bias voltage applied to each vertical current type magneto-resistive element 101 is ½. As a result, the problem of bias dependence where an increase in the bias voltage reduces the MR ratio can be solved.

In the case where a CPP GMR element is used as each of the vertical current type magneto-resistive element 101, the entire resistance can be increased since the vertical current type magneto-resistive elements 101 are electrically connected in series. Therefore, a high output is obtained with a small amount of current.

Figure 11:
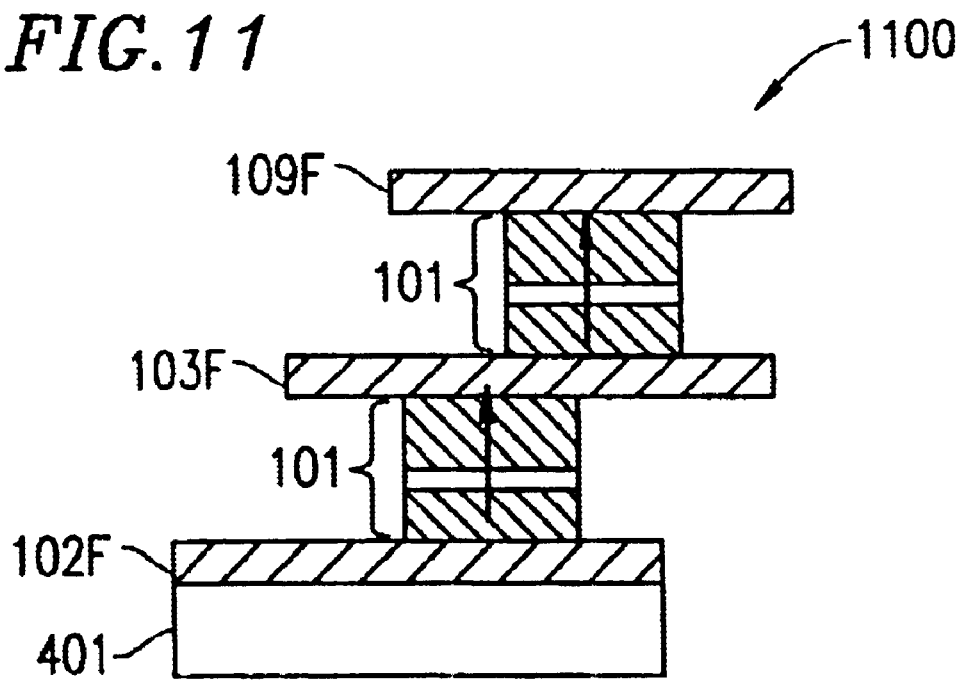
FIG. 11 is a cross-sectional view of still another multiple element magneto-resistive device according to the first example of the present invention in which vertical current type magneto-resistive elements are connected in series.

FIG. 11 is a cross-sectional view of still another multiple element magneto-resistive device 1100 according to the first example including vertical current type magneto-resistive elements 101 connected in series. Identical elements as those described above with reference to FIG. 10 will bear identical reference numerals and detailed descriptions thereof will be omitted.

As shown in FIG. 11, the two vertical current type magneto-resistive elements 101 are shifted with respect to each other in a longitudinal direction of the conductor 103F. In this example also, one of the vertical current type magneto-resistive elements is located on an opposite side to the other vertical current type magneto-resistive element with respect to the conductor 103F. Since the two vertical current type magneto-resistive elements 101 are connected in series like the multiple element magneto-resistive device 1000 (FIG. 10), a similar effect to that of the multiple element magneto-resistive device 1000 is provided. The multiple element magneto-resistive device 700 described above with reference to FIG. 7 also provides a similar effect since the two vertical current type magneto-resistive elements 101 are connected in series through the conductors 103Da, 102D and 103Db.

FIGS. 12 through 16 are cross-sectional views illustrating a method for producing the multiple element magneto-resistive device 1000 shown in FIG. 10. In the case where a CPP GMR element is used as each vertical current type magneto-resistive element 101, the resistance of the vertical current type magneto-resistive element 101 can be increased by reducing the area thereof and increasing the height thereof in the direction in which the current flows. It is difficult to produce a vertical current type magneto-resistive element 101 having a reduced area and an increased height so that the resistance is sufficiently high, using a precision processing process due to the limit of a lithography processing technique. Therefore, the method illustrated in FIGS. 12 through 16 is used to sequentially form the vertical current type magneto-resistive elements 101 while connecting the elements 101 in series, so that the resistance is increased stop by step.

Figure 12:
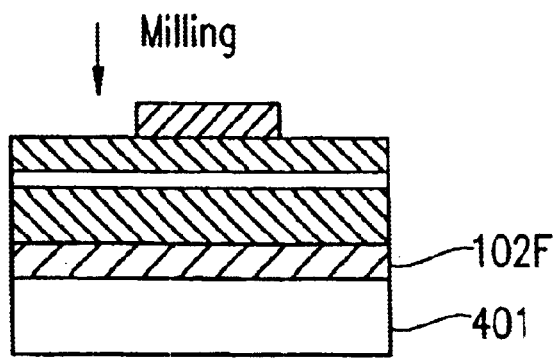
FIG. 12 is a cross-sectional view illustrating a step of producing a multiple element magneto-resistive device according to the first example of the present invention.
Figure 13:
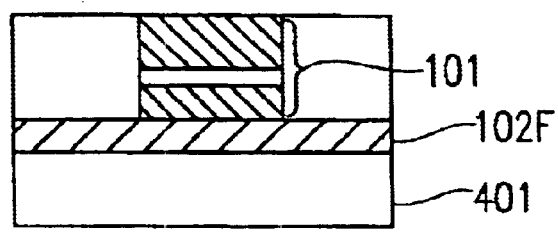
FIG. 13 is a cross-sectional view illustrating a step of producing a multiple element magneto-resistive device according to the first example of the present invention.
Figure 14:
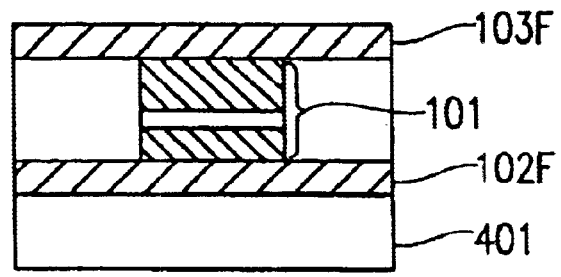
FIG. 14 is a cross-sectional view illustrating a step of producing a multiple element magneto-resistive device according to the first example of the present invention.

Referring to FIGS. 12 and 13, the conductor 102F is formed on the substrate 401, and a layer of a material for a first vertical current type magneto-resistive element is formed on the conductor 102F. A resist layer is formed on the layer of the material for the first vertical current type magneto-resistive element so as to cover a portion thereof. A portion which is not covered by the resist layer is removed by milling, thereby forming the first vertical current type magneto-resistive element 101. Then, an insulating layer for insulating the conductor 102F and the conductor 103F from each other is formed so as to surround the vertical current type magneto-resistive element 101. The resist layer is removed to obtain a laminate shown in FIG. 13. As shown in FIG. 14, the conductor 103F is formed on the first vertical current type magneto-resistive element 101.

Figure 15:
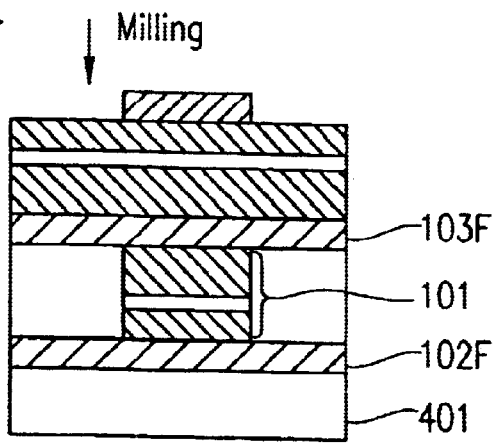
FIG. 15 is a cross-sectional view illustrating a step of producing a multiple element magneto-resistive device according to the first example of the present invention.
Figure 16:
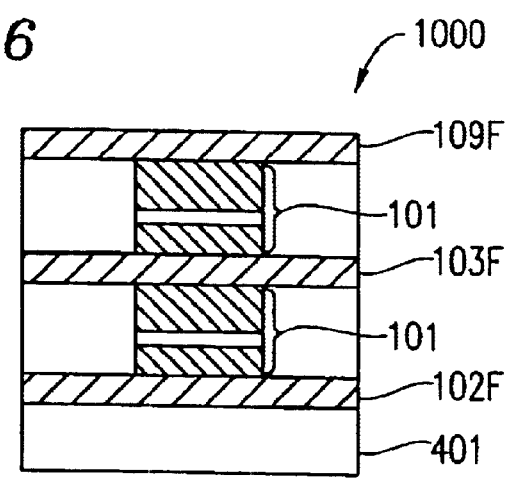
FIG. 16 is a cross-sectional view illustrating a step of producing a multiple element magneto-resistive device according to the first example of the present invention.

Referring to FIG. 15, a layer of a material for a second vertical current type magneto-resistive element is formed on the conductor 103F. Similarly to the above, a resist layer is formed on the layer of the material for the second vertical current type magneto-resistive element so as to cover a portion thereof. A portion which is not covered by the resist layer is removed by milling, thereby forming the second vertical current type magneto-resistive element 101 as shown in FIG. 16. An insulating layer for insulating the conductor 103F and the conductor 109F from each other is formed so as to surround the vertical current type magneto-resistive element 101. Then, the conductor 109F is formed on the second vertical current type magneto-resistive element 101. Thus, the multiple element magneto-resistive device 1000 is completed.

Figure 17:
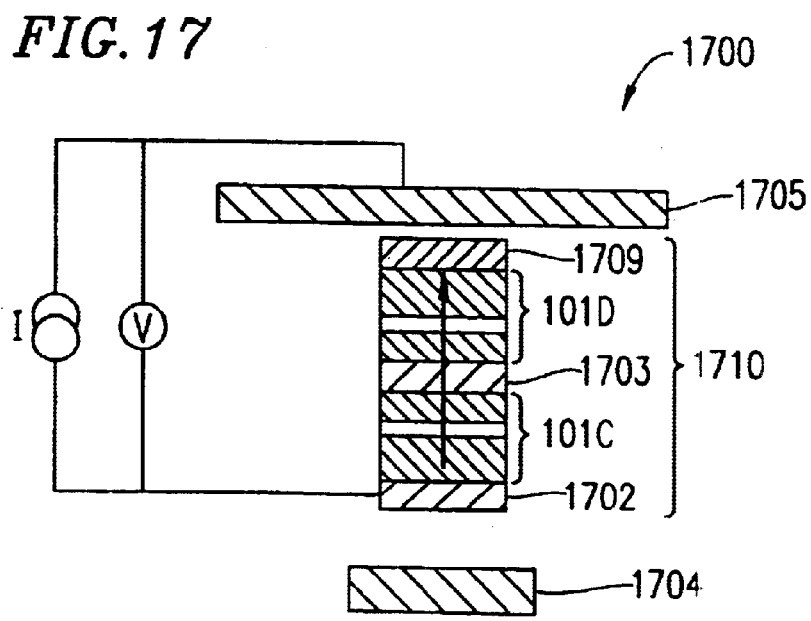
FIG. 17 is a cross-sectional view of a memory cell of an MRAM including a multiple element magneto-resistive device according to the first example of the present invention.

FIG. 17 is a cross-sectional view of a memory cell 1700, of an MRAM, including a multiple element magneto-resistive device. Identical elements as those described above with reference to FIG. 10 will bear identical reference numerals and detailed descriptions thereof will be omitted.

The memory cell 1700 includes a multiple element magneto-resistive device 1710. The multiple element magneto-resistive device 1710 includes two vertical current type magneto-resistive elements 101C and 101D. Each of the vertical current type magneto-resistive elements 101C and 101D is, for example, a TMR element or a CPP GMR element. A nonmagnetic conductive layer 1703 is provided between the two vertical current type magneto-resistive elements 101C and 101D. A non-magnetic conductive layer 1702 is provided on a surface of the vertical current type magneto-resistive element 101C opposite to the non-magnetic conductive layer 1703. A non-magnetic conductive layer 1709 is provided on a surface of the vertical current type magneto-resistive element 101D opposite to the non-magnetic conductive layer 1703. A bit line 1705 is provided in the vicinity of the non-magnetic conductive layer 1709 on the side opposite to the vertical current type magneto-resistive element 101D. A write line 1704 is provided in the vicinity of the non-magnetic conductive layer 1702 on the side opposite to the vertical current type magneto-resistive element 101C. Thus, the two vertical current type magneto-resistive elements 101C and 101D are electrically connected in series by the non-magnetic conductive layers 1702, 1703 and 1709. The write line 1704 and the bit line 1705 are provided so as to interpose the multiple element magneto-resistive device 1710.

In the memory cell 1700 of an MRAM including the multiple element magneto-resistive device 1710, when a TMR element is used as each vertical current type magneto-resistive element 101, the bias voltage is divided for two vertical current type magneto-resistive elements 101 since the two vertical current type magneto-resistive elements 101 are connected in series. Therefore, the bias voltage applied to each vertical current type magneto-resistive element 101 is ½. As a result, the problem of bias dependence where an increase in the bias voltage reduces the MR ratio can be solved.

In the case where a CPP GMR element is used as each of the vertical current type magneto-resistive element 101, the entire resistance can be increased since the vertical current type magneto-resistive elements 101 are electrically connected in series. Therefore, a high output is obtained with a small amount of current.

EXAMPLE 2

Figure 18:
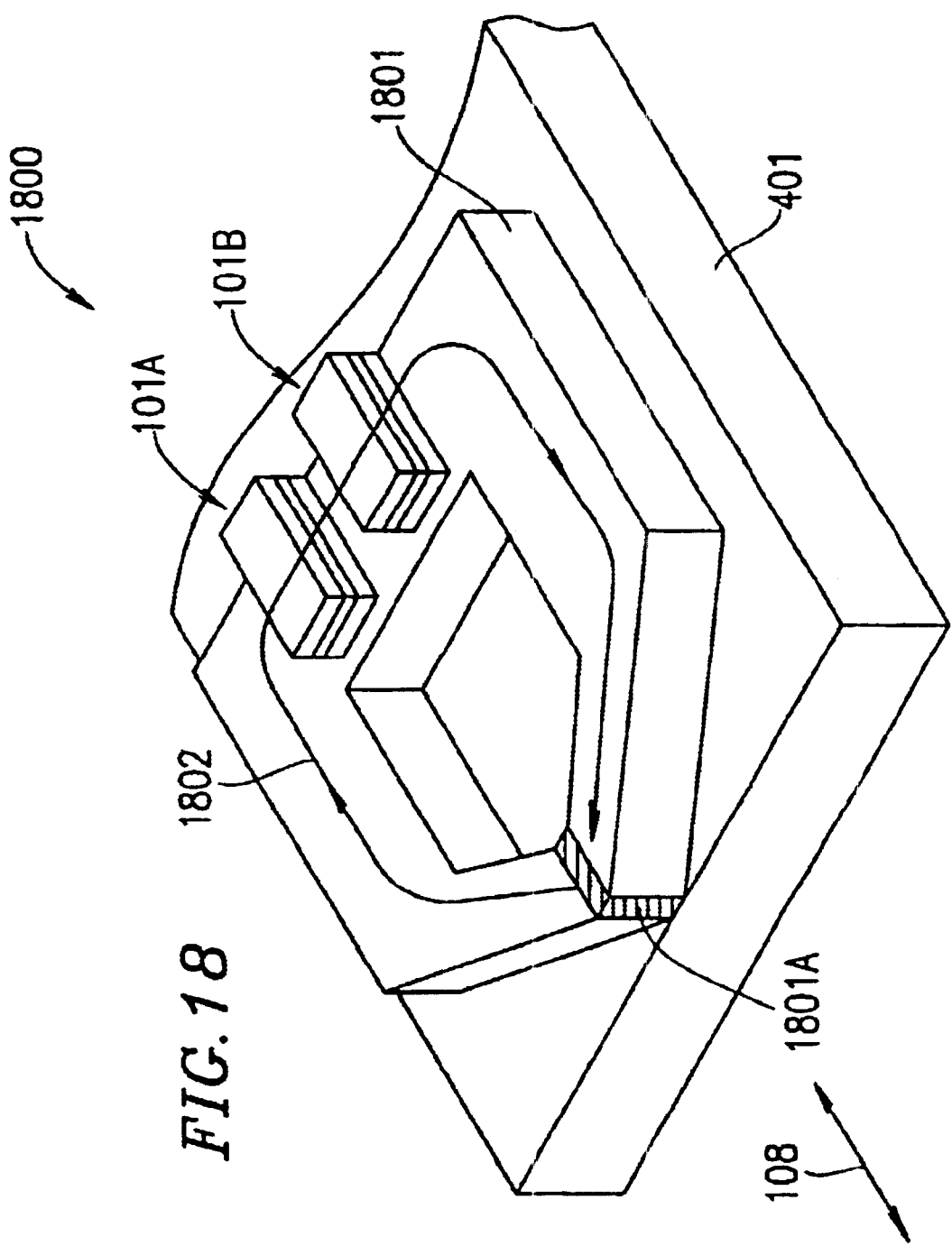
FIG. 18 is an isometric view of a multiple element magneto-resistive device according to a second example of the present invention, including vertical current type magneto-resistive elements on the opposite side of a substrate with respect to a yoke.
Figure 19A:
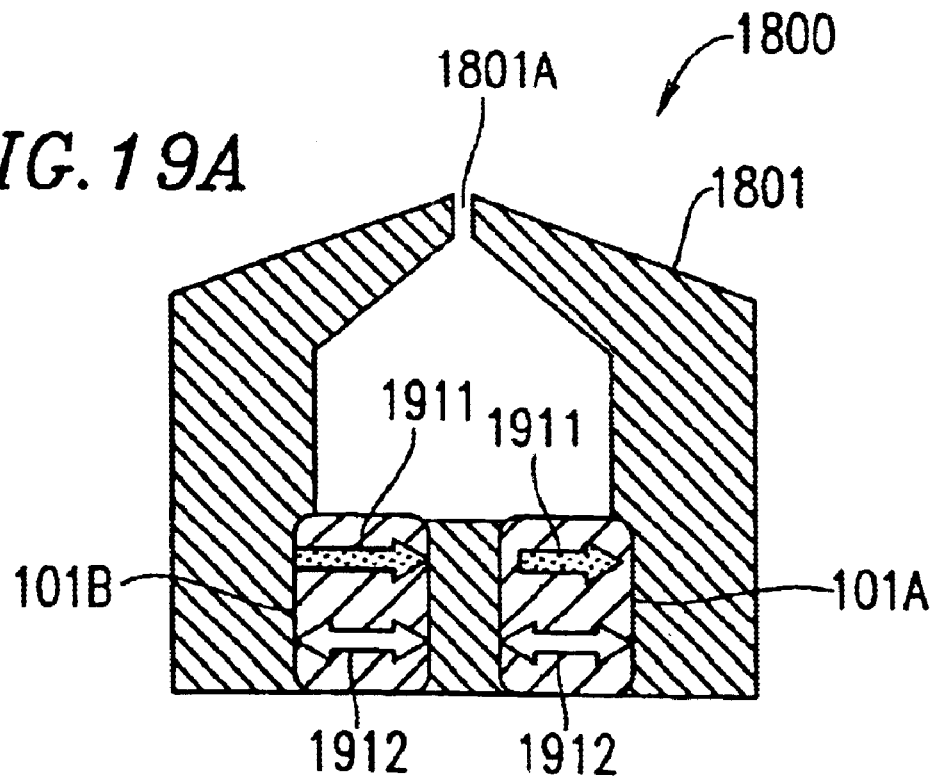
FIG. 19A is a cross-sectional view of the multiple element magneto-resistive device shown in FIG. 18 parallel to an external magnetic field shown in FIG. 18.
Figure 19B:
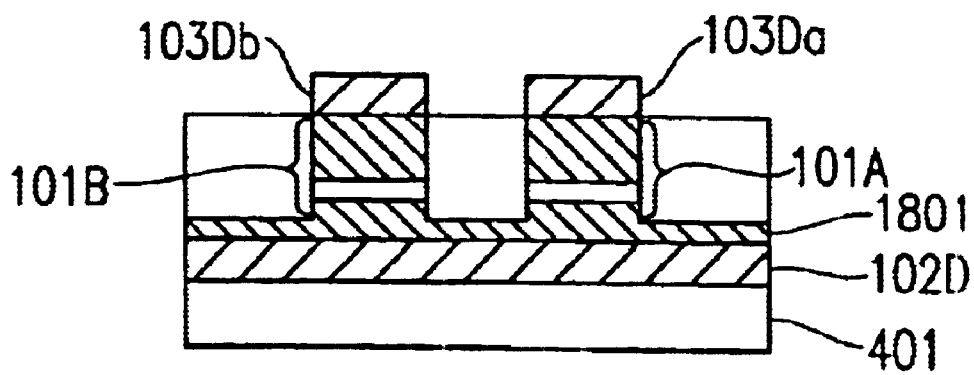
FIG. 19B is a cross-sectional view of the multiple element magneto-resistive device shown in FIG. 18 vertical to the external magnetic field shown in FIG. 18.
Figure 20A:
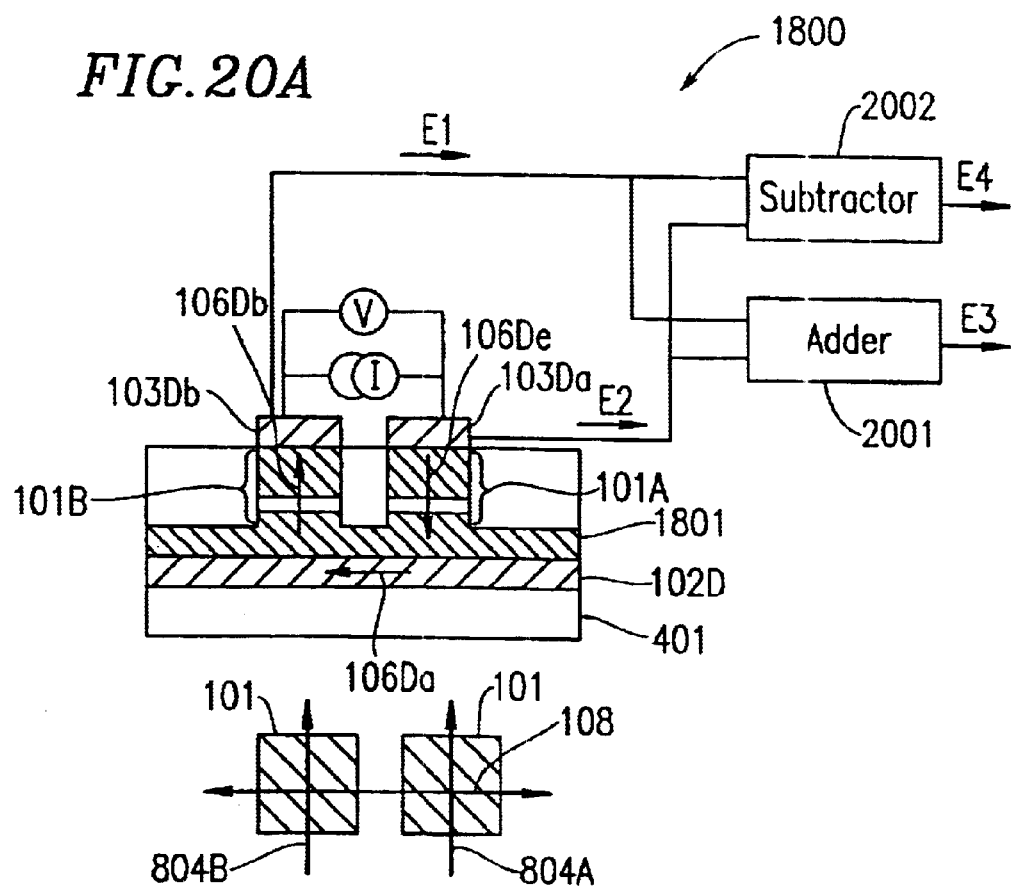
FIG. 20A is a cross-sectional view illustrating how to connect the vertical current type magneto-resistive elements in the multiple element magneto-resistive device shown in FIG. 18.
Figure 20B:
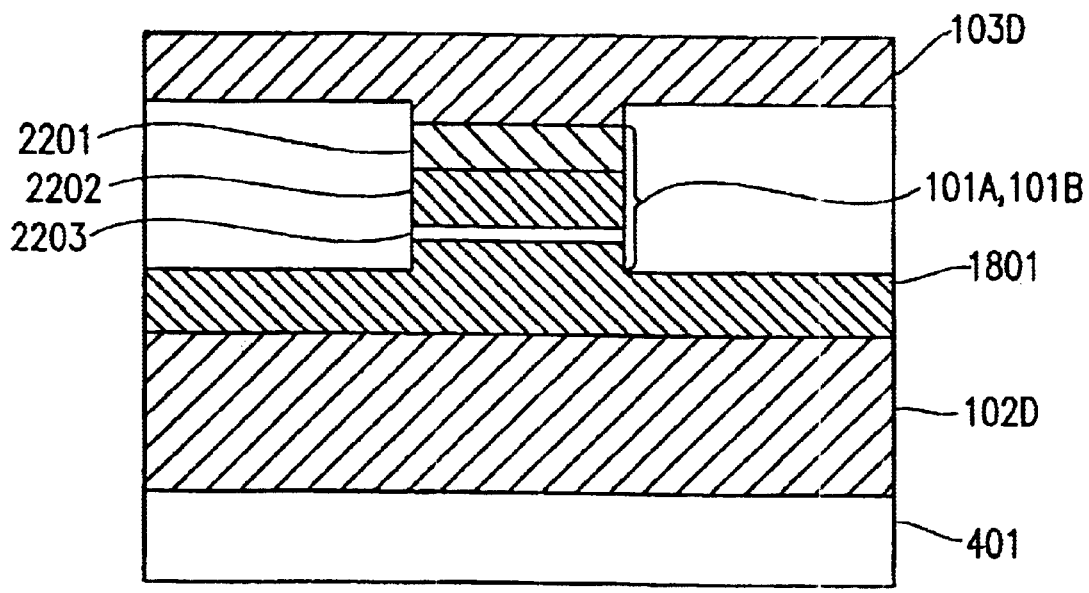
FIG. 20B is a cross-sectional view of a part of the multiple element magneto-resistive device shown in FIG. 18.

FIG. 18 is an isometric view of a multiple element magneto-resistive device 1800 according to a second example of the present invention. The multiple element magneto-resistive device 1800 includes vertical current type magneto-resistive elements 101 on an opposite side to a substrate with respect to a yoke. In other words, the substrate is provided on an opposite side to the vertical current type magneto-resistive elements 101 with respect to the yoke. FIG. 19A is a cross-sectional view of the multiple element magneto-resistive device 1800 parallel to an external magnetic field 108 shown in FIG. 18. FIG. 19B is a cross-sectional view of the multiple element magneto-resistive device 1800 vertical to the external magnetic field 108. FIG. 20A illustrates how to connect the vertical current type magneto-resistive elements 101 in the multiple element magneto-resistive device 1800. FIG. 20B is a cross-sectional view illustrating a part of the multiple element magneto-resistive device 1800 shown in FIG. 18. Identical elements as those described above with reference to FIG. 7 will bear identical reference numerals and detailed descriptions thereof will be omitted. Here, the vertical current type magneto-resistive element 101 on the right in FIGS. 19A and 19B is represented by reference numeral 101A, and the vertical current type magneto-resistive element 101 on the left in FIGS. 19A and 19B is represented by reference numeral 101B for the sake of clarity.

With reference to FIGS. 18, 19A, 19B, 20A and 20B, the multiple element magneto-resistive device 1800 includes a substrate 401 having a surface parallel to an external magnetic field 108. A substantially C-shaped yoke 1801 is provided on the substrate 401. The yoke 1801 has a magnetic gap 1801A at a position facing a magnetic recording medium (not shown). Flux lines of the external magnetic field 108 from the magnetic recording medium pass through the magnetic gap 1801A and are in the yoke 1801 in a direction of arrow 1802. On the yoke 1801, two vertical current type magneto-resistive elements 101A and 101B are provided so as to oppose the magnetic gap 1801A. The two vertical current type magneto-resistive elements 101 are arranged along arrow 1802. A conductor 102D (FIG. 19B) is provided on an opposite side to the vertical current type magneto-resistive elements 101 with respect to the yoke 1801. The conductor 102D extends along arrow 1802 in which the external magnetic field 108 runs. A conductor 103Da is provided on the vertical current type magneto-resistive element 101A, and a conductor 103Db is provided on the vertical current type magneto-resistive element 101B. Each of the vertical current type magneto-resistive elements 101A and 101B includes a tunneling layer 2203 (FIG. 20B) provided on the yoke 1801, a fixed layer 2202 (also referred to as a "pin layer") provided on the tunneling layer 2203, and an anti-ferromagnetic layer 2201 interposed between the fixed layer 2202 and the conductor 103Da or 103Db. A magnetization direction of the fixed layer 2202 does not change even when the external magnetic field 108 changes. The yoke 1801 acts as a free layer, a magnetization direction of which changes in accordance with a charge in the magnitude of the external magnetic field 108.

Referring to FIGS. 19A, 19B and 20A, the multiple element device 1800 includes an adder 2001. The vertical current type magneto-resistive element 101B outputs an output E1 in accordance with a change in the magnitude of the external magnetic field 108. The vertical current type magneto-resistive element 101A outputs an output E2 in accordance with a change in the magnitude of the external magnetic field 108. The adder 2001 outputs an output E3, which is the addition result of the outputs E1 and E2. The adder 2001 is an addition circuit or an addition element usually used in the field of semiconductors.

Herein, the polarity of the vertical current type magneto-resistive element is defined as follows regarding a TMR element. The case where a tunneling current flows between two magnetic layers interposing at least a nonmagnetic layer therebetween is considered. And the spins concerned are conserved through tunneling process. When such conductive spins are majority spins or minority spins with respect to both two magnetic layers with the same specific external magnetic field, the polarity is positive. When such conductive spins are majority spins with respect to one magnetic layer, and are minority spins with respect to the other magnetic layer, the polarity is negative. The expression of the "same polarity" means that the vertical current type magneto-resistive elements 101A and 101B are both positive or negative, and the expression of the "different polarities" means that one is positive and the other is negative. That is to say, the "same polarity" means that with the same specific external magnetic field, both magneto-resistive elements are in high resistance state or in low resistance state; and the "different polarities" means that one is in high resistance state and the other is in low resistance state.

The vertical current type magneto-resistive elements 101A and 101B have the same polarity. When a magnetization direction 1911 of the fixed layer and a magnetization direction 1912 of the free layer are parallel to each other, the vertical current type magneto-resistive elements 101A and 101B each generates a low output. When the magnetization direction 1911 of the fixed layer and the magnetization direction 1912 of the free layer are anti-parallel to each other, the vertical current type magneto-resistive elements 101A and 101B each generates a high output.

The multiple element magneto-resistive device 1800 having such a structure performs addition as follows.

Figure 21A:
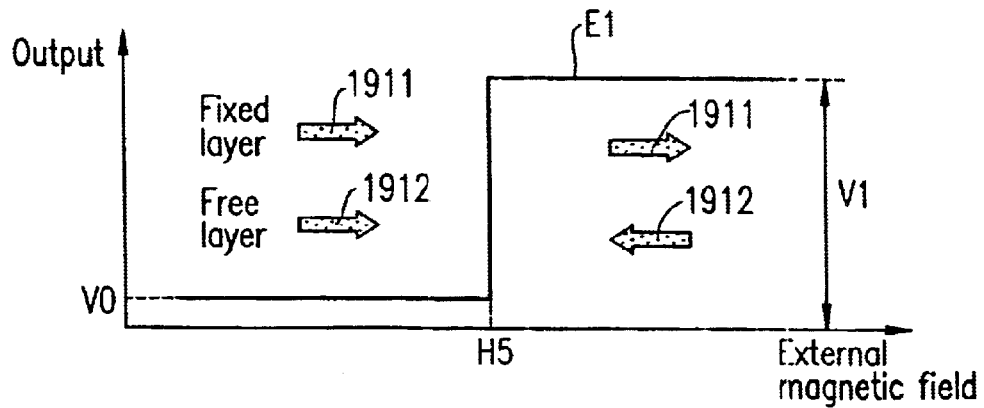
FIG. 21A is a graph illustrating an addition operation of the multiple element magneto-resistive device shown in FIG. 18.
Figure 21B:
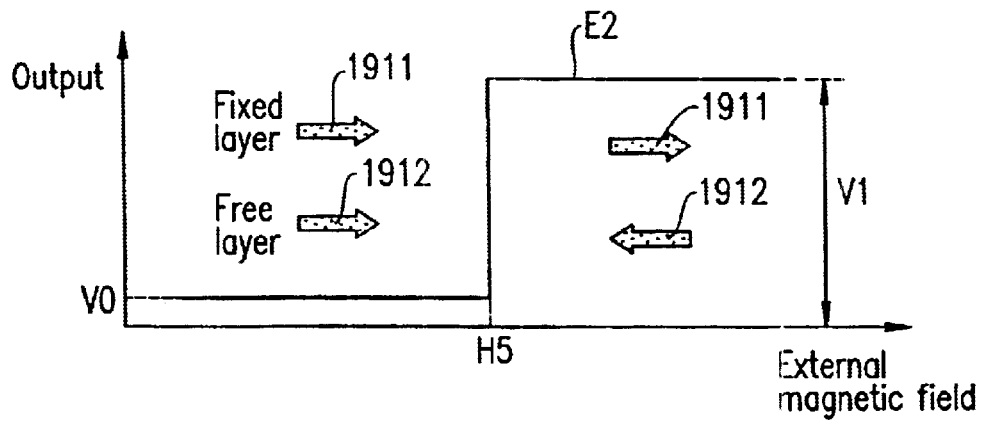
FIG. 21B is a graph illustrating an addition operation of the multiple element magneto-resistive device shown in FIG. 18.
Figure 21C:
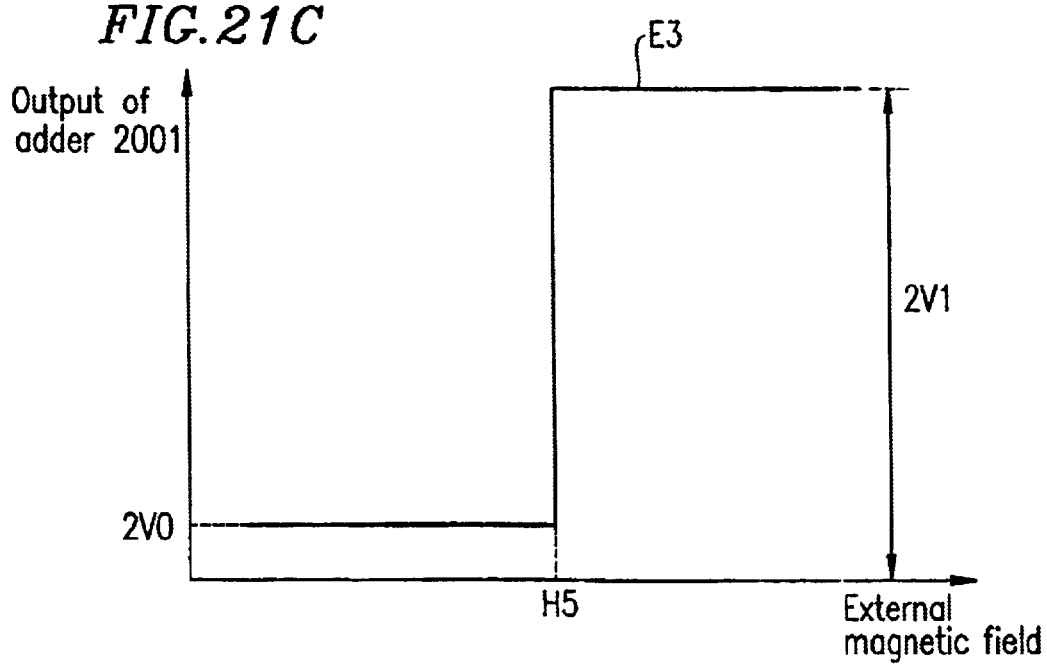
FIG. 21C is a graph illustrating an addition operation of the multiple element magneto-resistive device shown in FIG. 18.

FIG. 21A is a graph illustrating the output E1 which is generated by the vertical current type magneto-resistive element 101B in accordance with the change in the magnitude of the external magnetic field 108. FIG. 21B is a graph illustrating the output E2 which is generated by the vertical current type magneto-resistive element 101A in accordance with the change in the magnitude of the external magnetic field 108. FIG. 21C is a graph illustrating the output E3 generated by the adder 2001, which is the addition result of the outputs E1 and E2. In FIGS. 21 through 21C, the horizontal axis represents the magnitude of the external magnetic field 108. The vertical axis in FIG. 21A represents the output of the vertical current type magneto-resistive element 101B. The vertical axis in FIG. 21B represents the output of the vertical current type magneto-resistive element 101A. The vertical axis in FIG. 21C represents the adder 2001.

Referring to FIG. 21A, the magnetization direction 1911 of the fixed layer of the vertical current type magneto-resistive element 101B does not change and is constantly directed to the right in the sheet of paper of FIG. 21A even when the magnitude of the external magnetic field 108 changes. The magnetization direction 1912 of the free layer is directed to the right when the magnitude of the external magnetic field 108 is less than H5, and is directed to the left when the magnitude of the external magnetic field 108 is H5 or higher. Thus, the magnetization direction 1912 of the free layer changes in accordance with the change in the magnitude of the external magnetic field 108.

When the magnitude of the external magnetic field 108 is less than H5, the magnetization direction 1911 of the fixed layer and the magnetization direction 1912 of the free layer are both directed to the right and thus are parallel to each other. Therefore, the output E1 is V0, which represents a low level. When the magnitude of the external magnetic field 108 is H5 or higher, the magnetization direction 1911 remains directed to the right and the magnetization direction 1912 is changed to be directed to the left. Thus, the magnetization direction 1911 and the magnetization direction 1912 are anti-parallel to each other. Therefore, the output E1 is V1, which represents a high level.

Referring to FIG. 21B, like in FIG. 20A, when the magnitude of the external magnetic field 108 is less than H5, the magnetization direction 1911 of the fixed layer and the magnetization direction 1912 of the free layer are both directed to the right and parallel to each other. Since the vertical current type magneto-resistive element 101A has the same polarity as that of the vertical current type magneto-resistive element 101B, the output E2 is V0, which represents a low level. When the magnitude of the external magnetic field 108 is H5 or higher, the magnetization direction 1911 remains directed to the right and the magnetization direction 1912 is changed to be directed to the left. Thus, the magnetization direction 1911 and the magnetization direction 1912 are anti-parallel to each other. Since the vertical current type magneto-resistive element 101A has the same polarity as that of the vertical current type magneto-resistive element 101B, the output E2 is V1, which represents a high level.

Referring to FIG. 21C, the adder 2001 adds the output E1 and E2 and outputs the addition result as the output E3. When the magnitude of the external magnetic field 108 is less than H5, the output E3 is 2V0. When the magnitude of the external magnetic field 108 is H5 or higher, the output E3 is 2V1.

FIG. 22 shows a conventional magneto-resistive device 2300 including one vertical current type magneto-resistive element 101. Identical elements as those described above with reference to FIGS. 19A and 19B will bear identical reference numerals and detailed descriptions thereof will be omitted. The one vertical current type magneto-resistive element 101 in FIG. 22 is the same as that of the vertical current type magneto-resistive element 101B shown in FIG. 21A. Namely, a magnetization direction 1911 of the fixed layer of the vertical current type magneto-resistive element 101 shown in FIG. 22 does not change and remains directed to the right even when the magnitude of the external magnetic field 108 changes. The magnetization direction 1912 of the free layer is directed to the right when the magnitude of the external magnetic field 108 is less than H5, and is directed to the left when the magnitude of the external magnetic field 108 is H5 or more.

When the magnitude of the external magnetic field 108 is less than H5, the magnetization direction 1911 and the magnetization direction 1912 are both directed to the right and parallel to each other. Therefore, the output of the vertical current type magneto-resistive element 101 is V0, which represents a low level. When the magnitude of the external magnetic field 108 is H5 or higher, the magnetization direction 1911 remains directed to the right and the magnetization direction 1912 is changed to be directed to the left. Thus, the magnetization direction 1911 and the magnetization direction 1912 are anti-parallel to each other. Therefore, the output of the vertical current type magneto-resistive element 101 is V1, which represents a high level.

The multiple element magneto-resistive device 1800 including two vertical current type magneto-resistive elements 101 provides the output of 2V1, which is twice the output of the conventional magneto-resistive device 2300 including one vertical current type magneto-resistive element 101. The multiple element magneto-resistive device 1800, in which the outputs of the two vertical current type magneto-resistive elements 101 are added together, can improve the degree of asymmetry of the outputs, as compared to the conventional magneto-resistive device 2300.

A subtraction operation of the multiple element magneto-resistive device 1800 will be described.

The multiple element magneto-resistive device 1800 may include a subtractor 2002 for generating an output E4 which is obtained by subtracting the output E1 generated by the vertical current type magneto-resistive element 101B from the output E2 generated by the vertical current type magneto-resistive element 101A. The subtractor 2002 is a subtraction circuit or a subtraction element usually used in the field of semiconductors.

Figure 23A:
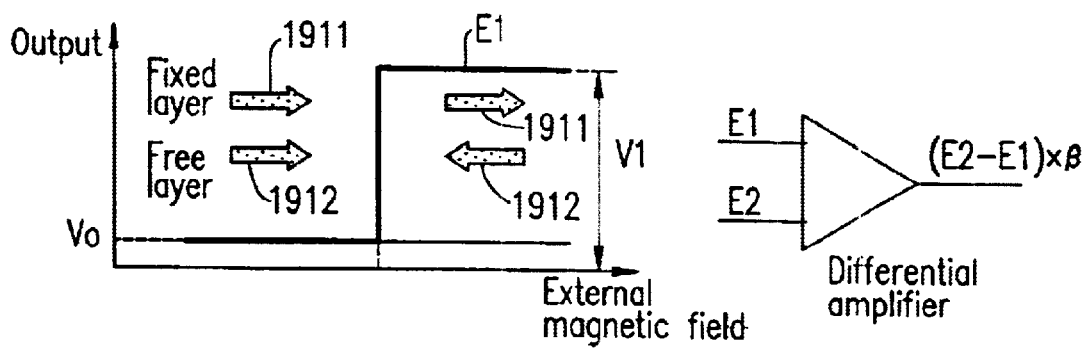
FIG. 23A is a graph illustrating a subtraction operation of the multiple element magneto-resistive device shown in FIG. 18.
Figure 23B:
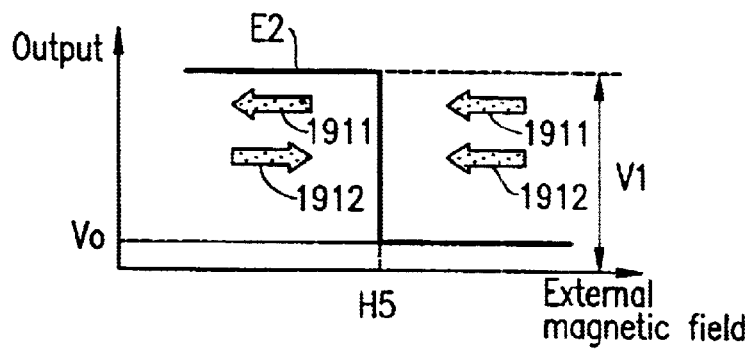
FIG. 23B is a graph illustrating a subtraction operation of the multiple element magneto-resistive device shown in FIG. 18.
Figure 23C:
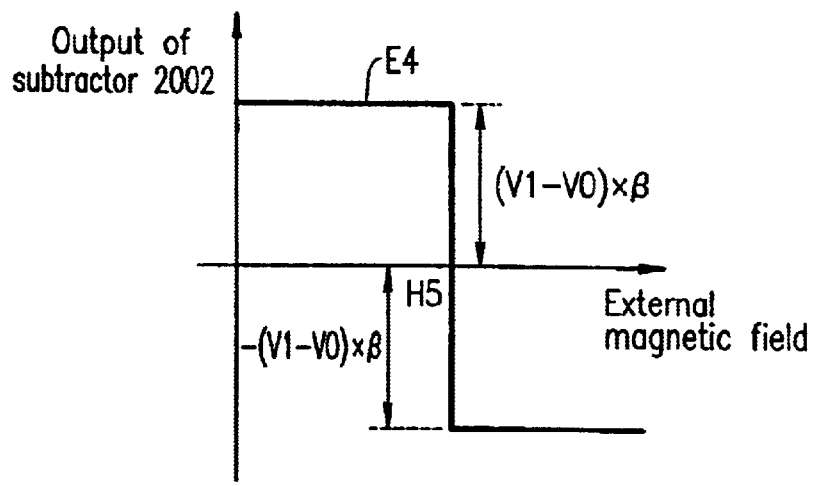
FIG. 23C is a graph illustrating a subtraction operation of the multiple element magneto-resistive device shown in FIG. 18.

FIG. 23A is a graph illustrating the output E1 which is generated by the vertical current type magneto-resistive element 101B in accordance with the change in the magnitude of the external magnetic field 108. FIG. 23B is a graph illustrating the output E2 which is generated by the vertical current type magneto-resistive element 101A in accordance with the change in the magnitude of the external magnetic field 108. FIG. 23C is a graph illustrating the output E4 generated by the subtract or 2002, which is the subtraction result of subtracting the output E1 from the output E2. FIG. 23A is the same as FIG. 21A.

Referring to FIG. 23B, a magnetization direction 1911 of the fixed layer of the vertical current type magneto-resistive element 101A is directed to the left, which is opposite to the magnetization direction 1911 of the fixed layer of the vertical current type magneto-resistive element 101B shown in FIG. 23A. A magnetization direction 1912 of the free layer of the vertical current type magneto-resistive element 101A is directed to the right when the magnitude of the external magnetic field 108 is less than H5, and is directed to the left when the magnitude of the external magnetic field 108 is H5 or higher.

When the magnitude of the external magnetic field 108 is less than H5, the magnetization direction 1911 is directed to the left and the magnetization direction 1912 is directed to the right. Thus, the magnetization directions 1911 and 1912 are anti-parallel to each other. Therefore, the output E1 of the vertical current type magneto-resistive element 101A is V1, which represents a high level. When the magnitude of the external magnetic field 108 is H5 or higher, the magnetization direction 1911 remains directed to the left and the magnetization direction 1912 is changed to be directed to the left. Thus, the magnetization directions 1911 and 1912 are parallel to each other. Therefore, the output E1 of the vertical current type magneto-resistive element 101A is V0, which represents a low level.

Referring to FIG. 23C, the subtractor 2002 subtracts the output E1 from the output E2 and outputs the addition result as the output E4. When the magnitude of the external magnetic field 108 is less than H5, the output E4 is (V1−V0)×β. When the magnitude of the external magnetic field 108 is H5 or higher, the output E4 is −(V1−V0)×β. Here, β represents a coefficient of a differential amplifier used as the subtracter 2002.

In the case where the outputs of two vertical current type magneto-resistive elements 101A and 101B having the same polarity are processed with subtraction, thermal fluctuation and thermal spikes are generated substantially simultaneously in the two vertical current type magneto-resistive elements 101A and 101B. So, such thermal fluctuations which are generated when a current starts to flow in the vertical current type magneto-resistive elements 101A and 101B are cancelled by subtraction. And due to the narrow flying height, thermal spikes which are generated between the magnetic head and the magnetic recording medium when the magnetic head and the magnetic recording medium contact each other are also cancelled by subtraction. Thus, the influence of the thermal fluctuation and narrow flying height can be alleviated.

Figure 23D:
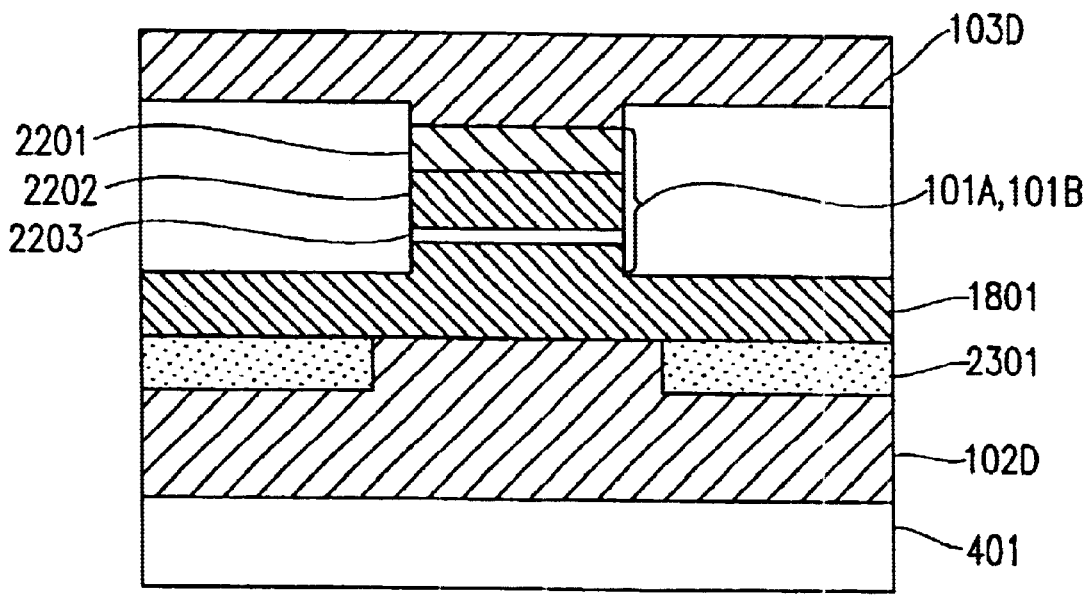
FIG. 23D is a cross-sectional view illustrating an alternative structure of a part of the multiple element magneto-resistive device shown in FIG. 18.

FIG. 23D shows another structure of a part of the multiple element magneto-resistive device 1800 shown in FIGS. 19A and 19B. Identical elements as those described above with reference to FIG. 20B will bear identical reference numerals and detailed descriptions thereof will be omitted. The structure shown in FIG. 23D is formed as follows. After the conductor 102D is formed, a hard magnetic layer or anti-ferromagnetic layer 2301 is buried. After a surface of the layer 2301 is flattened, the yoke 1801 is formed.

In the multiple element magneto-resistive device 1800, the conductors may be located as shown in FIG. 4 or 6. In this case, a bias magnetic field as shown in FIG. 5 can be provided. Alternatively, the conductors may be located as shown in FIG. 7 or 9. In this case, a bias magnetic field as shown in FIG. 8 can be provided.

Figure 24:
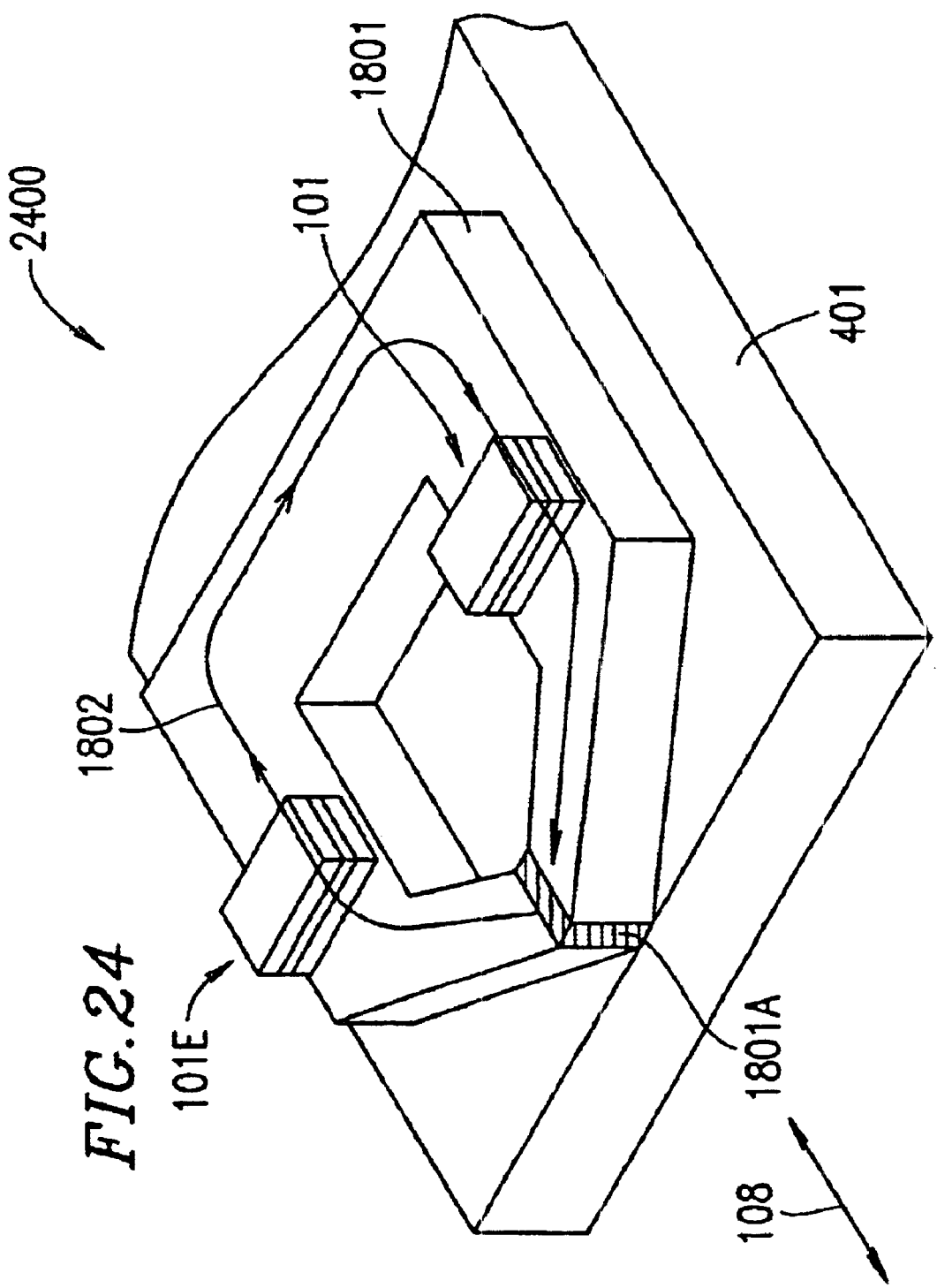
FIG. 24 is an isometric view of another multiple element magneto-resistive device according to the second example of the present invention, including vertical current type magneto-resistive elements on the opposite side of a substrate with respect to a yoke.
Figure 25A:
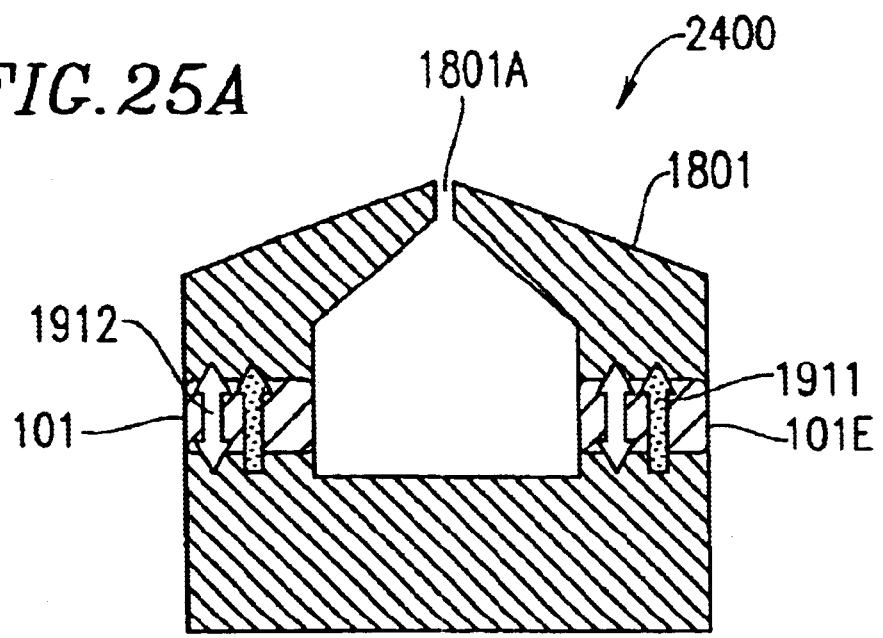
FIG. 25A is a cross-sectional view of the multiple element magneto-resistive device shown in FIG. 24 parallel to an external magnetic field shown in FIG. 24.
Figure 25B:
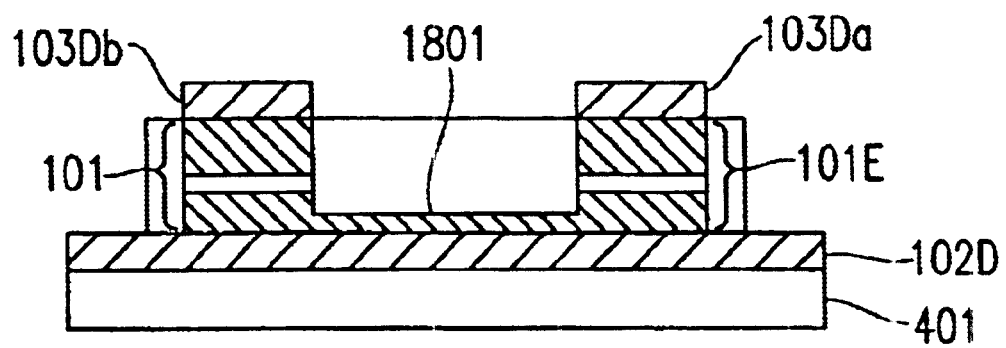
FIG. 25B is a cross-sectional view of the multiple element magneto-resistive device shown in FIG. 24 vertical to the external magnetic field shown in FIG. 24.

FIG. 24 is an isometric view of another multiple element magneto-resistive device 2400 according to the second example of the present invention. The multiple element magneto-resistive device 2400 includes vertical current type magneto-resistive elements 101 and 101E on an opposite side to a substrate with respect to a yoke. In other words, the substrate is provided on an opposite side to the vertical current type magneto-resistive elements 101 and 101B with respect to the yoke. FIG. 25A is a cross-sectional view of the multiple element magneto-resistive device 2400 parallel to an external magnetic field 108 shown in FIG. 24. FIG. 25B is a cross-sectional view of the multiple element magneto-resistive device 2400 vertical to the external magnetic field 108. FIG. 26 illustrates how to connect the vertical current type magneto-resistive elements 101 and 101E in the multiple element magneto-resistive device 2400. Identical elements as those described above with reference to FIGS. 18, 19A, 19B, 20A and 20B will bear identical reference numerals and detailed descriptions thereof will be omitted.

With reference to FIGS. 24, 25A, and 25B and 26, the multiple element magneto-resistive device 2400 includes a substrate 401 having a surface parallel to an external magnetic field 108. A substantially C-shaped yoke 1801 is provided on the substrate 401. The yoke 1801 has a magnetic gap 1801A at a position facing a magnetic recording medium (not shown). Flux lines of the external magnetic field 108 from the magnetic recording medium pass through the magnetic gap 1801A and are in the yoke 1801 in a direction of arrow 1802. As shown in FIG. 24, two vertical current type magneto-resistive elements 101 and 101E are provided on two side areas of the yoke 1801. The vertical current type magneto-resistive elements 101 and 101E are located symmetrically with respect to the magnetic gap 1801A. A conductor 102D (FIG. 25B) is provided on an opposite side to the vertical current type magneto-resistive elements 101 and 101E with respect to the yoke 1801. A conductor 103Da is provided on the vertical current type magneto-resistive element 101E, and a conductor 103Db is provided on the vertical current type magneto-resistive element 101. The yoke 1801 acts as a free layer, a magnetization direction of which changes in accordance with a change in the magnitude of the external magnetic field 108.

Referring to FIGS. 25A, 25B and 26, the two vertical current type magneto-resistive elements 101 and 101E have different polarities to each other. The vertical current type magneto-resistive element 101 generates a low level output when a magnetization direction 1911 of the fixed layer and a magnetization direction 1912 of the free layer are parallel to each other, and generates a high level output when the magnetization directions 1911 and 1912 are anti-parallel to each other. By contrast, the vertical current type magneto-resistive element 101E generates a high level output when a magnetization direction 1911 of the fixed layer and a magnetization direction 1912 of the free layer pare parallel to each other, and generates a low level output when the magnetization directions 1911 and 1912 are anti-parallel to each other.

The multiple element device 2400 includes an adder 2001 for generating an output E3, which is an addition result of an output E1 from the vertical current type magneto-resistive element 101 and an output E2 for the vertical current type magneto-resistive element 101E.

The multiple element magneto-resistive device 2400 having such a structure performs addition as follows.

Figure 27A:
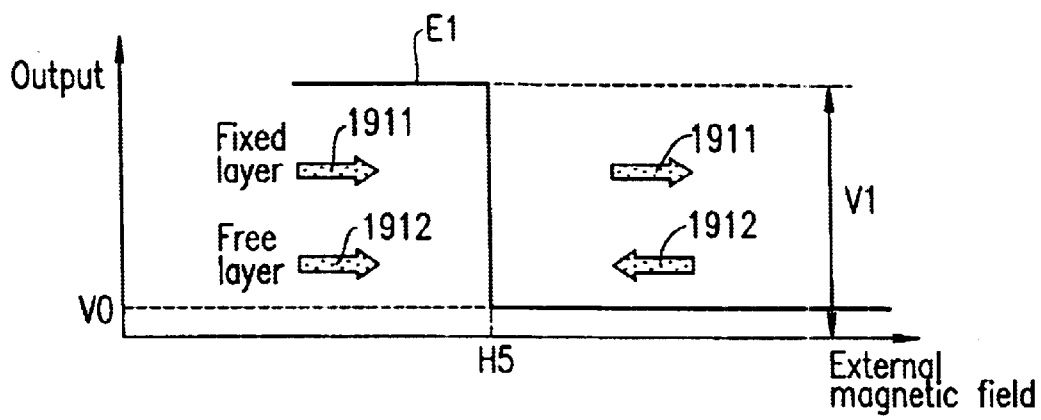
FIG. 27A is a graph illustrating an addition operation of the multiple element magneto-resistive device shown in FIG. 24.
Figure 27B:
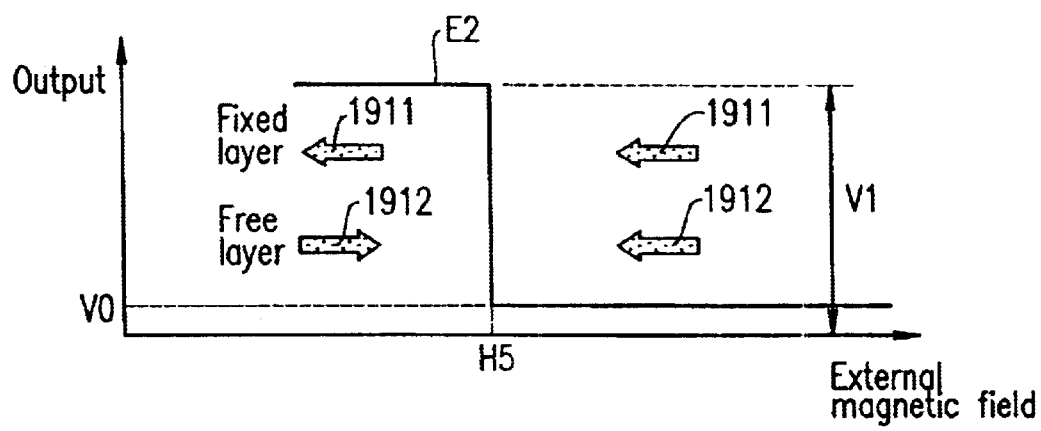
FIG. 27B is a graph illustrating an addition operation of the multiple element magneto-resistive device shown in FIG. 24.
Figure 27C:
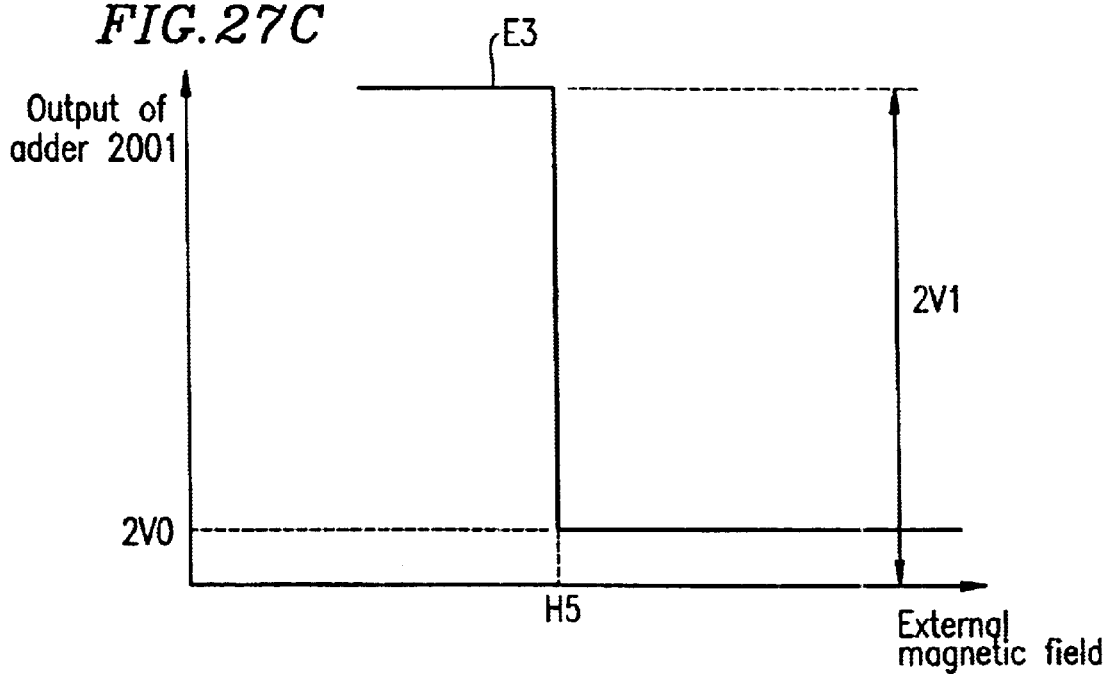
FIG. 27C is a graph illustrating an addition operation of the multiple element magneto-resistive device shown in FIG. 24.

FIG. 27A is a graph illustrating the output E1 which is generated by the vertical current type magneto-resistive element 101. FIG. 27B is a graph illustrating the output E2 which is generated by the vertical current type magneto-resistive element 101E. FIG. 27C is a graph illustrating the output E3 generated by the adder 2001, which is the addition result of the outputs E1 and E2. In FIGS. 27A through 27C, the horizontal axis represents the magnitude of the external magnetic field 108. The vertical axis in FIG. 27A represents the output of the vertical current type magneto-resistive element 101. The vertical axis in FIG. 27B represents the output of the vertical current type magneto-resistive element 101E. The vertical axis in FIG. 27C represents the adder 2001.

Referring to FIG. 27A, the magnetization direction 1911 of the fixed layer of the vertical current type magneto-resistive element 101 does not change and is constantly directed to the right in the sheet of paper of FIG. 27A even when the magnitude of the external magnetic field 108 changes. The magnetization direction 1912 of the free layer is directed to the right when the magnitude of the external magnetic field 108 is less than H5, and is directed to the left when the magnitude of the external magnetic field 108 is H5 or higher.

When the magnitude of the external magnetic field 108 is less than H5, the magnetization direction 1911 of the fixed layer and the magnetization direction 1912 of the free layer are parallel to each other. Therefore, the output E1 is V1, which represents a high level. When the magnitude of the external magnetic field 108 is H5 or higher, the magnetization direction 1911 remains directed to the right and the magnetization direction 1912 is changed to be directed to the left. Thus, the magnetization direction 1911 and the magnetization direction 1912 are anti-parallel to each other. Therefore, the output E1 is V0, which represents a low level.

Referring to FIG. 27B, when the magnitude of the external magnetic field 108 is less than H5, the magnetization direction 1911 of the fixed layer and the magnetization direction 1912 of the free layer of the vertical current type magneto-resistive element 101E are anti-parallel to each other. Since the vertical current type magneto-resistive element 101E has a different polarity from that of the vertical current type magneto-resistive element 101, the output E2 is V1, which represents a high level. When the magnitude of the external magnetic field 108 is H5 or higher, the magnetization direction 1911 remains directed to the right and the magnetization direction 1912 is changed to be directed to the left. Thus, the magnetization direction 1911 and the magnetization direction 1912 are parallel to each other. Since the vertical current type magneto-resistive element 101E has a different polarity from that of the vertical current type magneto-resistive element 101, the output E2 is V0, which represents a low level.

Referring to FIG. 27C, the adder 2001 adds the outputs E1 and E2 and outputs the addition result as the output E3. When the magnitude of the external magnetic field 108 is less than H5, the output E3 is 2V1. When the magnitude of the external magnetic field 108 is H5 or higher, the output E3 is 2V0.

In the multiple element magneto-resistive device 2400 including the two vertical current type magneto-resistive elements 101 and 101E, the outputs of both the vertical current type magneto-resistive elements 101 and 101E are added together. Therefore, like the multiple element magneto-resistive device 1800 (FIG. 18), the degree of asymmetry of the outputs can be improved, as compared to the conventional magneto-resistive device 2300 (FIG. 22).

A subtraction operation of the multiple element magneto-resistive device 2400 will be described.

The multiple element magneto-resistive device 2400 may include a subtractor 2002 for generating an output E4 which is obtained by subtracting the output E1 generated by the vertical current type magneto-resistive element 101 from the output E2 generated by the vertical current type magneto-resistive element 101E.

Figure 28A:
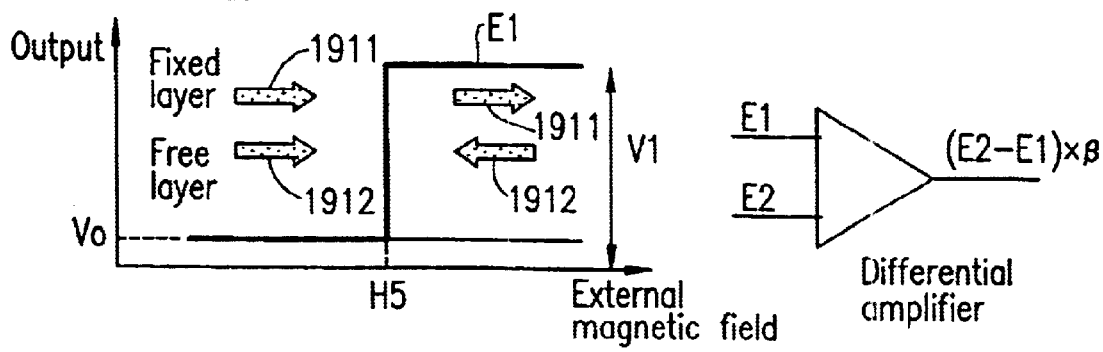
FIG. 28A is a graph illustrating a subtraction operation of the multiple element magneto-resistive device shown in FIG. 24.
Figure 28B:
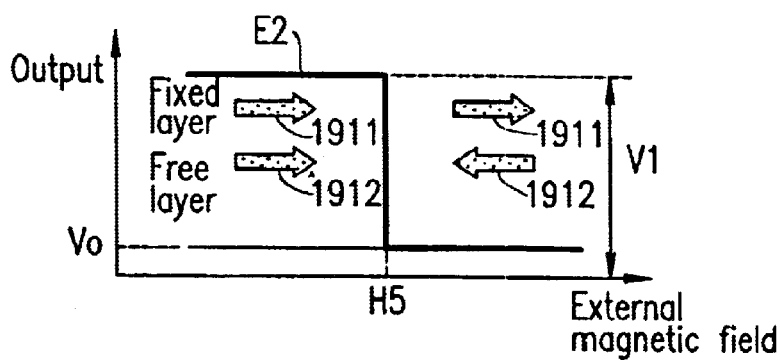
FIG. 28B is a graph illustrating a subtraction operation of the multiple element magneto-resistive device shown in FIG. 24.
Figure 28C:
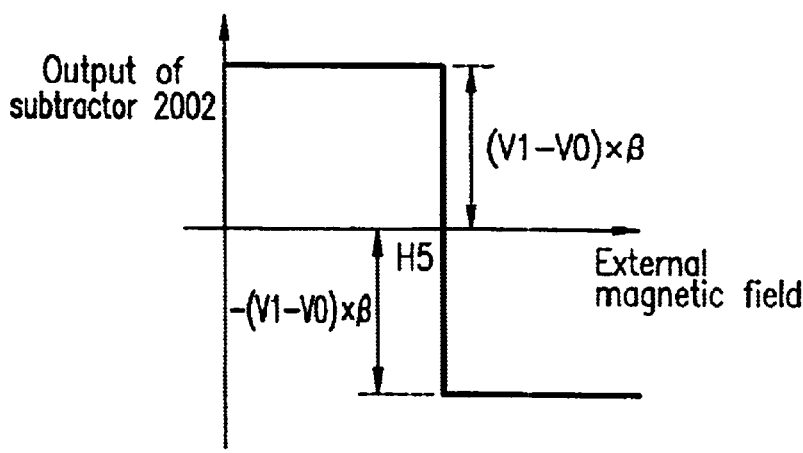
FIG. 28C is a graph illustrating a subtraction operation of the multiple element magneto-resistive device shown in FIG. 24.

FIG. 28A is a graph illustrating the output E1 which is generated by the vertical current type magneto-resistive element 101. FIG. 28B is a graph illustrating the output E2 which is generated by the vertical current type magneto-resistive element 101E. FIG. 28C is a graph illustrating the output E4 generated by the subtractor 2002, which is the subtraction result of subtracting the output E1 from the output E2. FIG. 28A is the same as FIG. 21A.

Referring to FIG. 28B, a magnetization direction 1911 of the fixed layer of the vertical current type magneto-resistive element 101E is directed to the right. A magnetization direction 1912 of the free layer of the vertical current type magneto-resistive element 101E is directed to the right when the magnitude of the external magnetic field 108 is less than H5, and is directed to the left when the magnitude of the external magnetic field 108 is H5 or higher.

When the magnitude of the external magnetic field 108 is less than H5, the magnetization direction 1911 and the magnetization direction 1912 are both directed to the right and parallel to each other. Since the vertical current type magneto-resistive element 101E has a different polarity from that of the vertical current type magneto-resistive element 101, the output E2 of the vertical current type magneto-resistive element 101B is V1, which represents a high level. When the magnitude of the external magnetic field 108 is H5 or higher, the magnetization direction 1911 remains directed to the right and the magnetization direction 1912 is changed to be directed to the left. Thus, the magnetization directions 1911 and 1912 are anti-parallel to each other. Since the vertical current type magneto-resistive element 101E has a different polarity from that of the vertical current type magneto-resistive element 101, the output E2 of the vertical current type magneto-resistive element 101E is V0, which represents a low level.

Referring to FIG. 28C, the subtractor 2002 subtracts the output E1 from the output E2 and outputs the addition result as the output E4. When the magnitude of the external magnetic field 108 is less than H5, the output E4 is $(V1-V0)\times\beta$. When the magnitude of the external magnetic field 108 is H5 or higher, the output E4 is $-(V1-V0)\times\beta$. Here, $\beta$ represents a coefficient of a differential amplifier used as the subtractor 2002.

In the case where the outputs of two vertical current type magneto-resistive elements 101 and 101E having different polarities from each other are processed with subtraction, thermal fluctuation and narrow flying height are generated substantially simultaneously in the two vertical current type magneto-resistive elements 101 and 101E when a current starts to flow in the vertical current type magneto-resistive elements 101 and 101E. Due to the thermal fluctuation and narrow flying height, thermal spikes generated between the magnetic head and the magnetic recording medium when the magnetic head and the magnetic recording medium contact each other are cancelled by subtraction. Thus, the influence of the thermal fluctuation and narrow flying height can be alleviated.

EXAMPLE 3

Figure 29:
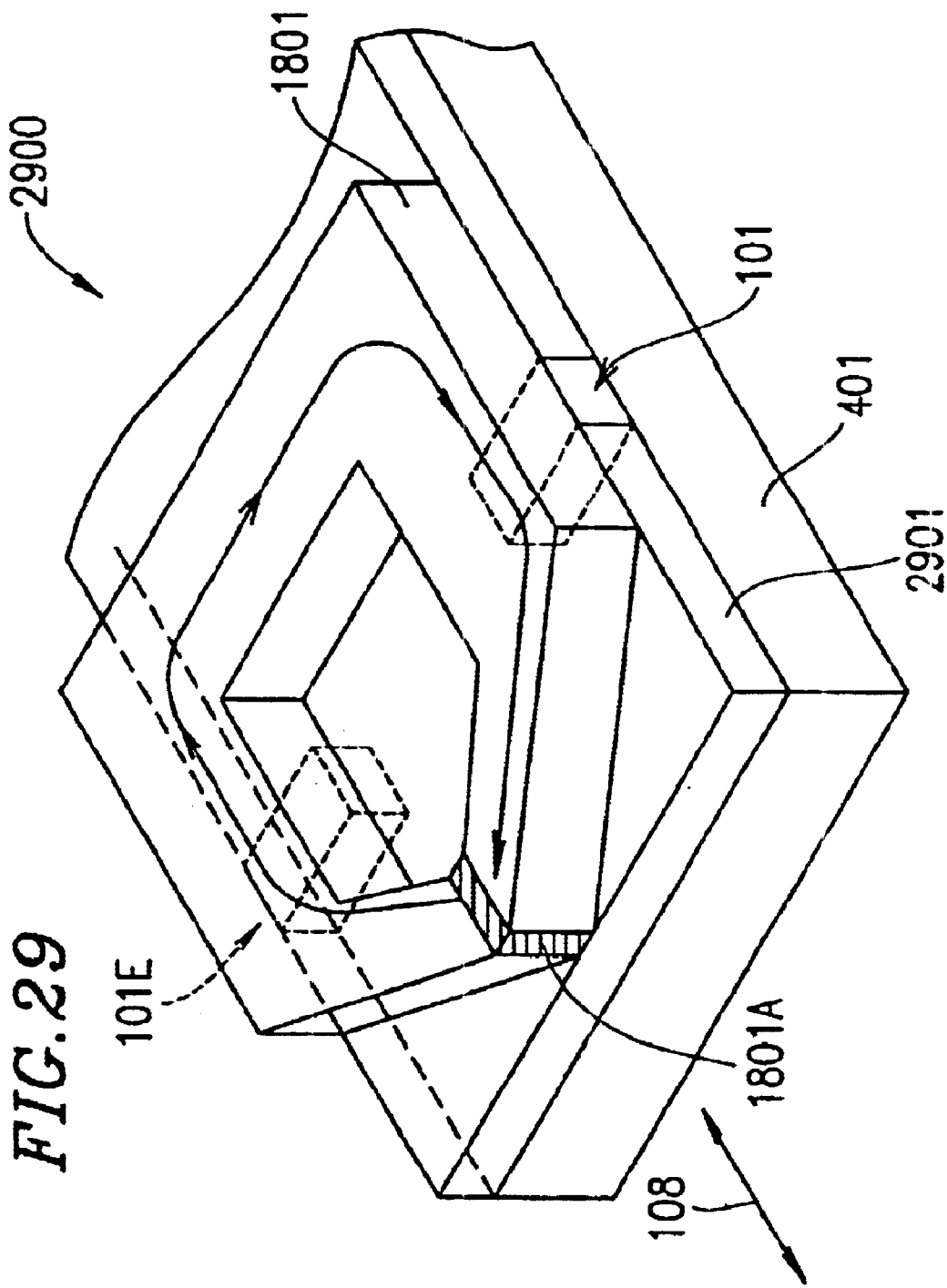
FIG. 29 is an isometric view of a multiple element magneto-resistive device according to a third example of the present invention, including vertical current type magneto-resistive elements interposed between a substrate and a yoke.
Figure 30A:
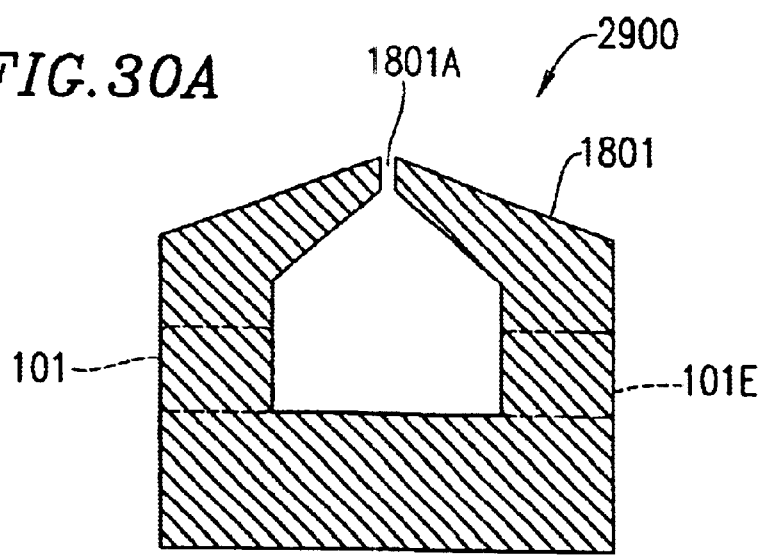
FIG. 30A is a cross-sectional view of the multiple element magneto-resistive device shown in FIG. 29 parallel to an external magnetic field shown in FIG. 29.
Figure 30B:
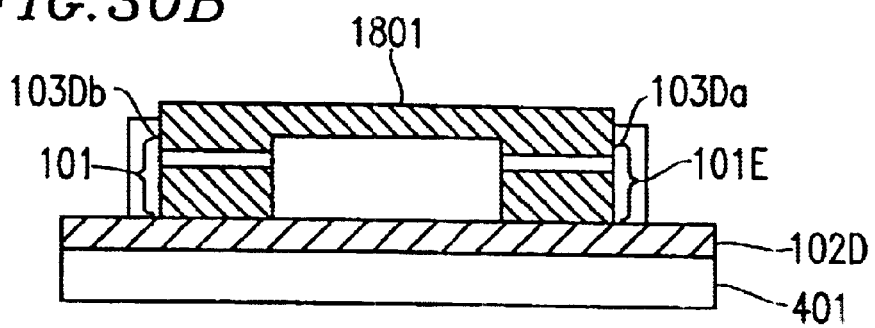
FIG. 30B is a cross-sectional view of the multiple element magneto-resistive device shown in FIG. 29 vertical to the external magnetic field shown in FIG. 29.
Figure 31:
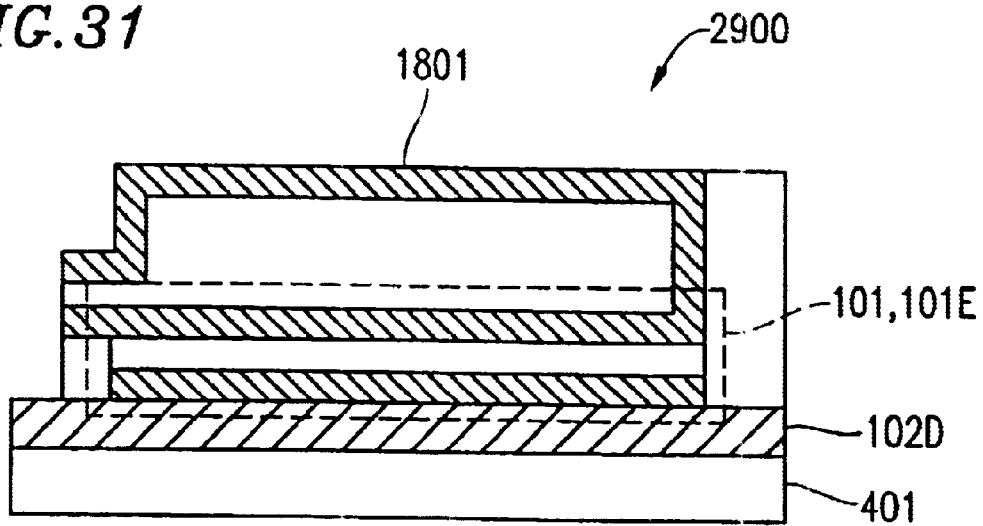
FIG. 31 is another vertical cross-sectional view of the multiple element magneto-resistive device shown in FIG. 29.
Figure 32:
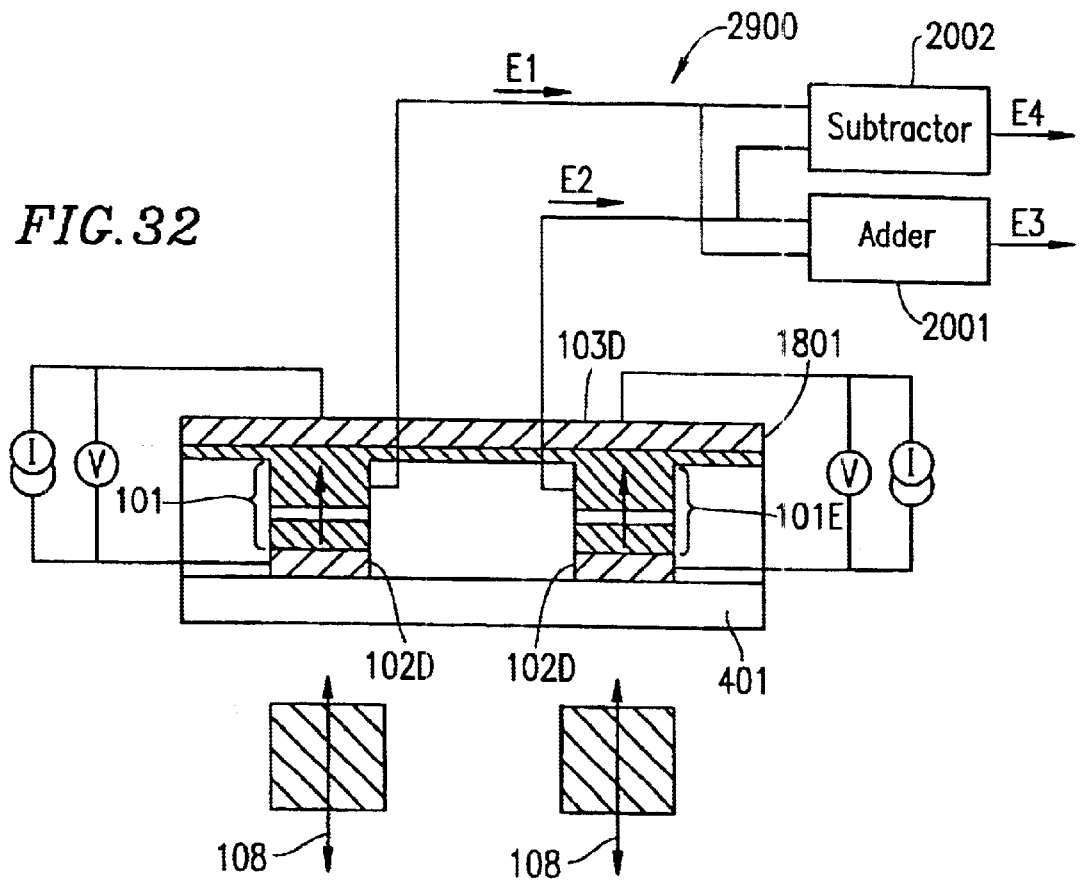
FIG. 32 is a cross-sectional view illustrating how to connect the vertical current type magneto-resistive elements in the multiple element magneto-resistive device shown in FIG. 29.

FIG. 29 is an isometric view of a multiple element magneto-resistive device 2900 according to a third example of the present invention. The multiple element magneto-resistive device 2900 includes vertical current type magnetoresistive elements 101 and 101E between a yoke 1801 and a substrate 401. In other words, the substrate 401 is provided on an opposite side to the yoke 1801 with respect to the vertical current type magneto-resistive elements 101 and 101E. FIG. 30A is a cross-sectional view of the multiple element magneto-resistive device 2900 parallel to an external magnetic field 108 shown in FIG. 29. FIG. 30B is a vertical cross-sectional view of the multiple element magneto-resistive device 2900. FIG. 31 is another vertical cross-sectional view of the multiple element magneto-resistive device 2900. FIG. 32 illustrates how to connect the vertical current type magneto-resistive elements 101 and 101E in the multiple element magneto-resistive device 2900. Identical elements as those described above with reference to FIGS. 24 through 26 will bear identical reference numerals and detailed descriptions thereof will be omitted.

Unlike the multiple element magneto-resistive device 2400, the multiple element magneto-resistive device 2900 includes the vertical current type magneto-resistive elements 101 and 101E between the yoke 1801 and the substrate 401. The vertical current type magneto-resistive elements 101 and 101E have different polarities from each other.

Figure 33:
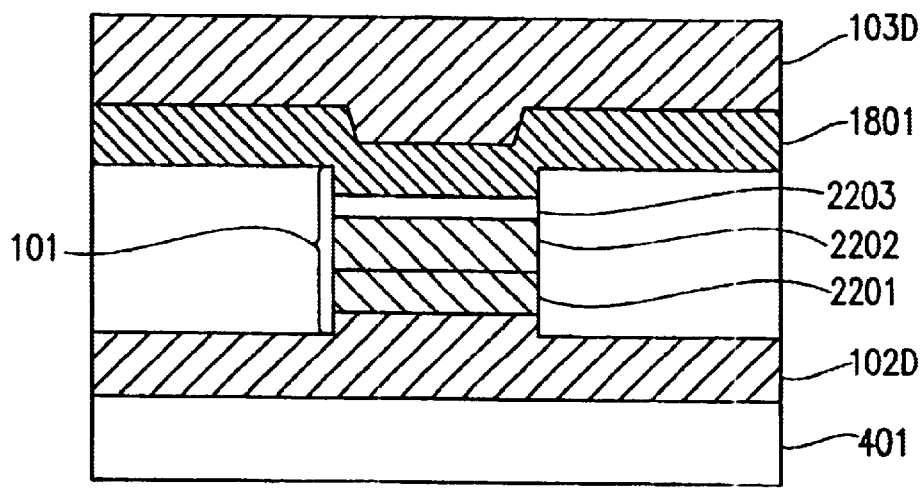
FIG. 33 is a cross-sectional view of a part of the multiple element magneto-resistive device shown in FIG. 29.

FIG. 33 is a cross-sectional view illustrating a part of the multiple element magneto-resistive device 2900 shown in FIG. 29. As shown in FIG. 33, the multiple element magneto-resistive device 2900 is produced as follows. A conductor 102D is formed on the substrate 401. After an anti-ferromagnetic layer 2201 is formed on the conductor 102D, a fixed layer 2202 (or a pin layer) is formed on the anti-ferromagnetic layer 2201. After a tunneling layer 2203 is formed on the fixed layer 2202, the yoke 1801 formed of a single or a multiple soft magnetic layers is formed thereon. Then, a conductor 103D is formed on the yoke 1801.

Figure 34:
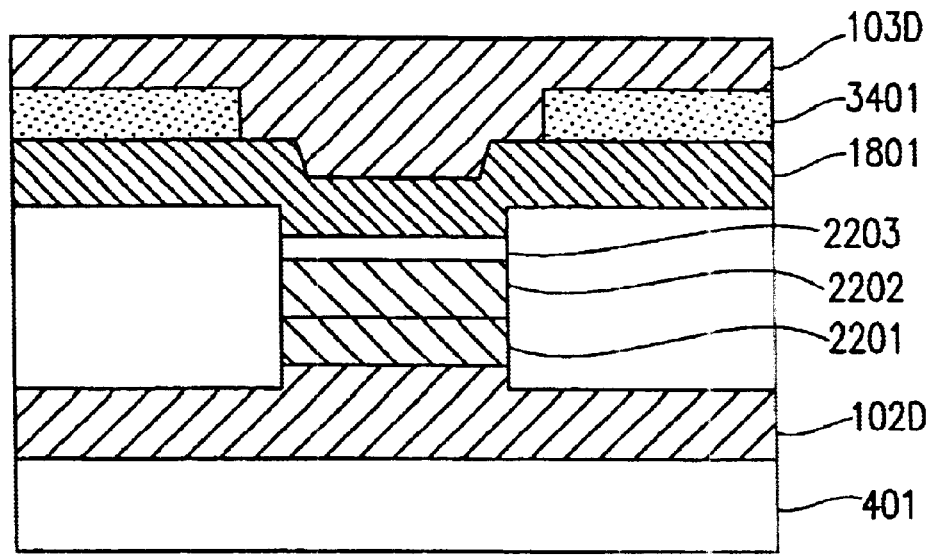
FIG. 34 is a cross-sectional view illustrating another structure of a part of the multiple element magneto-resistive device shown in FIG. 29.

FIG. 34 is a cross-sectional view illustrating another structure of a part of the multiple element magneto-resistive device 2900 shown in FIGS. 30A and 30B. As shown in FIG. 34, before the conductor 103D is formed, a hard magnetic layer or anti-ferromagnetic layer 3401 may be formed by a lithography processing technique.

Figure 35A:
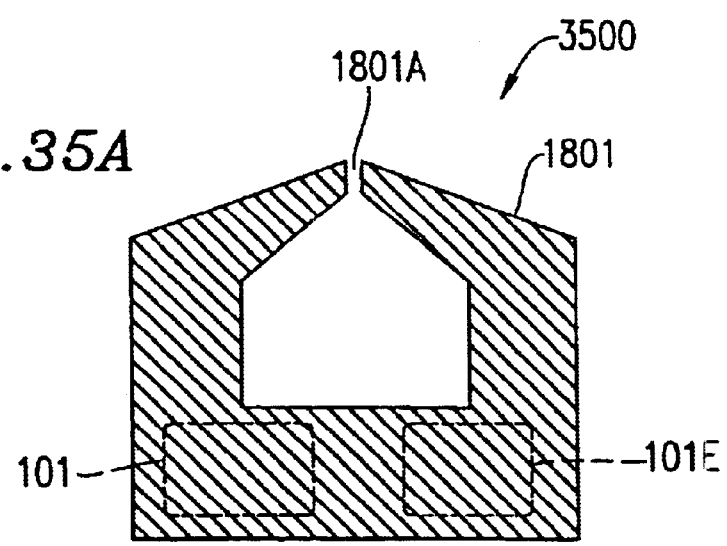
FIG. 35A is a horizontal cross-sectional view of another multiple element magneto-resistive device according to the third example of the present invention, including vertical current type magneto-resistive elements interposed between a substrate and a yoke.
Figure 35B:
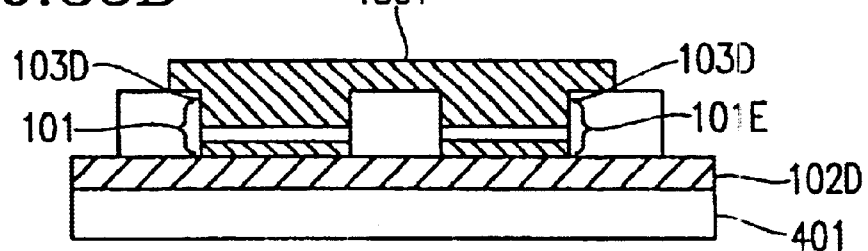
FIG. 35B is a vertical cross-sectional view of the multiple element magneto-resistive device shown in FIG. 35A.

FIG. 35A is a cross-sectional view illustrating another multiple element magneto-resistive device 3500 according to the third example, illustrating a cross-section of the device 3500 parallel to a substrate. FIG. 35B is a cross-sectional view illustrating the multiple element magneto-resistive device 3500, illustrating a cross-section of the device 3500 vertical to the substrate. The multiple element magneto-resistive device 3500 includes vertical current type magneto-resistive elements 101 and 101E between a yoke 1801 and a substrate 401. Identical elements as those described above with reference to FIGS. 18 through 23D will bear identical reference numerals and detailed descriptions thereof will be omitted. Unlike the multiple element magneto-resistive device 1800, in the multiple element magneto-resistive device 2900, the vertical current type magneto-resistive elements 101 and 101E have different polarities from each other and are provided between the yoke 1801 and the substrate 401.

Figure 36:
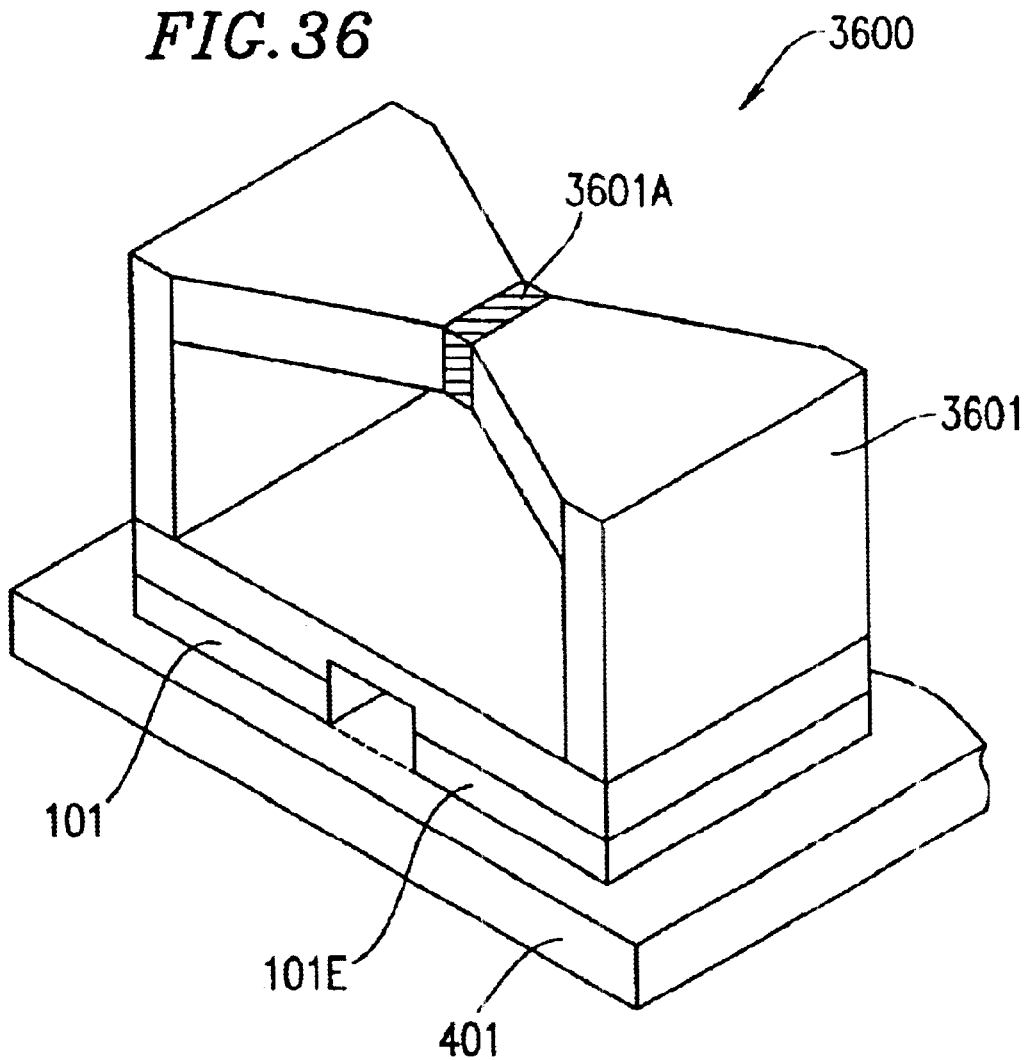
FIG. 36 is an isometric view of still another multiple element magneto-resistive device according to the third example of the present invention, including vertical current type magneto-resistive elements interposed between a substrate and a yoke.
Figure 37A:
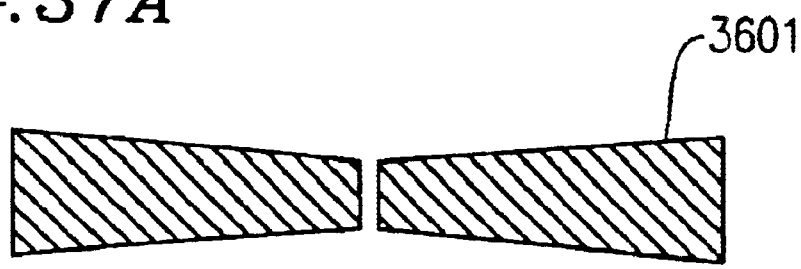
FIG. 37A is a horizontal cross-sectional view of the multiple element magneto-resistive device shown in FIG. 36.
Figure 37B:
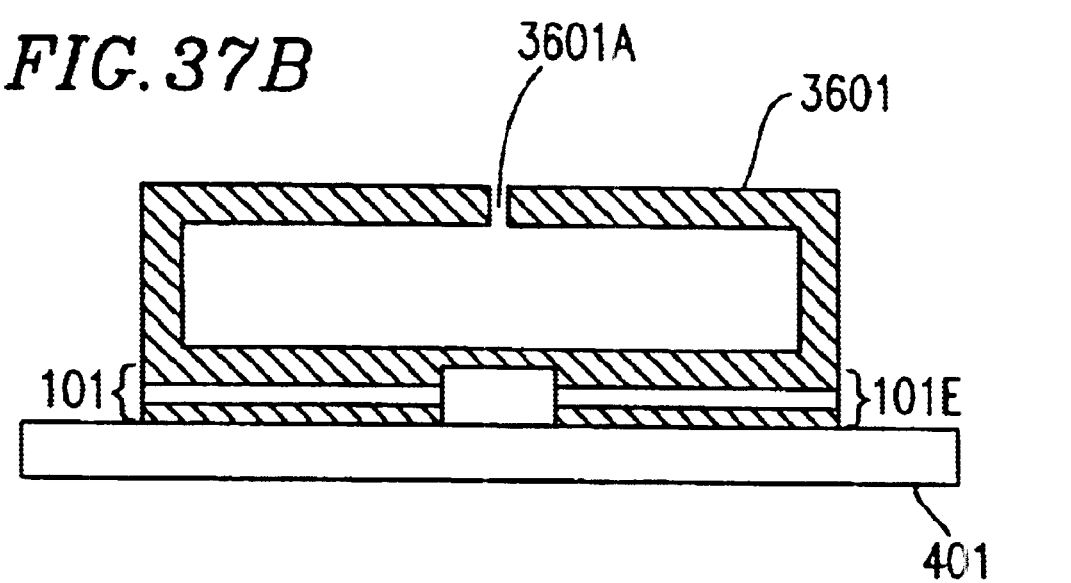
FIG. 37B is a vertical cross-sectional view of the multiple element magneto-resistive device shown in FIG. 36.

FIG. 36 is an isometric view of still another multiple element magneto-resistive device 3600 according to the third example. The multiple element magneto-resistive device 3600 includes vertical current type magneto-resistive elements 101 and 101E between a yoke 3601 and a substrate 401. FIG. 37A is a cross-sectional view of the multiple element magneto-resistive device 3600, illustrating a cross-section of the device 3600 parallel to a substrate. FIG. 37B is a cross-sectional view of the multiple element magneto-resistive device 3600, illustrating a cross-section of the device 3600 vertical to the substrate. Identical elements as those described above with reference to FIGS. 29 through 32 will bear identical reference numerals and detailed descriptions thereof will be omitted.

The above-described multiple element magneto-resistive devices each includes the yoke 1801 which extends in a direction parallel to the substrate 401; namely, the yoke 1801 is a horizontal yoke. The present invention is applicable to the multiple element magneto-resistive device 3600 including the yoke 3601 extending in a direction vertical to the substrate 401 (i.e., a vertical yoke). The yoke 3601 has a magnetic gap 3601A. The vertical current type magneto-resistive elements 101 and 101E are provided between the yoke 3601 and the substrate 401. The vertical current type magneto-resistive elements 101 and 101E have different polarities from each other.

Figure 38:
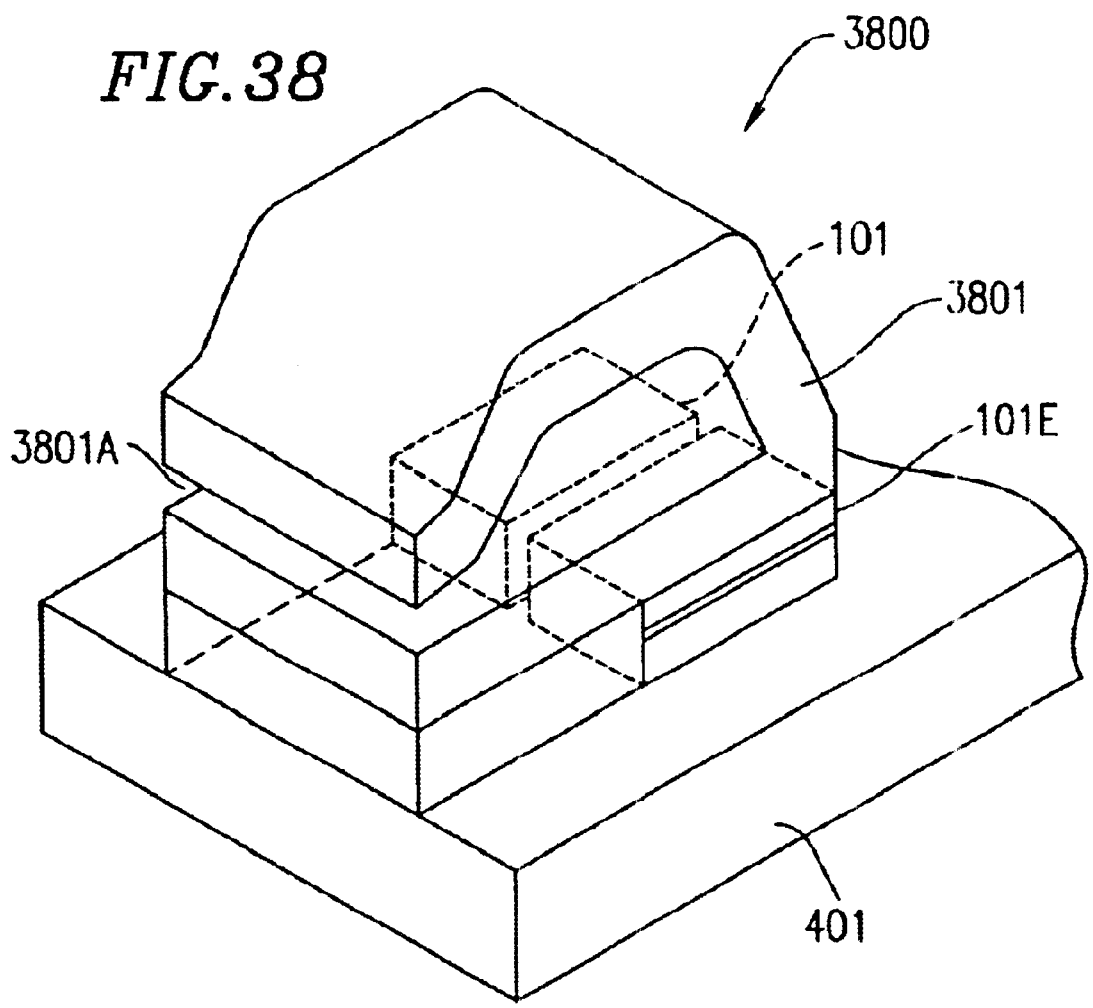
FIG. 38 is an isometric view of still another multiple element magneto-resistive device according to the third example of the present invention, including vertical current type magneto-resistive elements interposed between a substrate and a yoke.

FIG. 38 is an isometric view of still another multiple element magneto-resistive device 3800 according to the third example. The multiple element magneto-resistive device 3800 includes vertical current type magneto-resistive elements 101 and 101E between a yoke 3801 and a substrate 401. Identical elements as those described above with reference to FIGS. 29 through 32 will bear identical reference numerals and detailed descriptions thereof will be omitted.

In the above examples, each of the multiple element magneto-resistive devices is connected to an external device through an adder or a subtractor. The present invention is not limited to such a structure. A multiple element magneto-resistive device including a plurality of vertical current type magneto-resistive elements connected in series or parallel to each other may be directly connected to an external device.

The multiple element magneto-resistive device 3800 includes the yoke 3801. The yoke 3801 has a magnetic gap 3801A. As shown in FIG. 38A, the magnetic gap 3801A is formed parallel to the substrate 401. The vertical current type magneto-resistive elements 101 and 101E are provided between the yoke 3801 and the substrate 401. The vertical current type magneto-resistive elements 101 and 101E have different polarities from each other.

Use of a multiple element magneto-resistive device having a yoke structure for a magnetic head can reduce the thermal spike and also reduce the degree of asymmetry of the outputs.

In the case where a CPP GMR element for detecting a change in the relative magnetization angle between at least two magnetic bodies as a change in the mean free path of electrons is used as each vertical current type magneto-resistive element in the above examples, an effect of improving the resistance due to serial connection of the vertical current type magneto-resistive elements can be provided. In the case where the outputs from the two vertical current type magneto-resistive elements are processed with addition or subtraction, effects of, for example, reducing the thermal fluctuation and also reducing the degree of asymmetry of the outputs are provided.

In the above-described examples, the magnetic layers and the conductors can easily be formed by any of vacuum deposition techniques including IBD (ion beam deposition), sputtering, MBE, and ion plating. The nonmagnetic layers can easily be formed by any of usual techniques used for forming a compound including a technique of forming a layer using a compound itself, reactive deposition, reactive sputtering, ion assisting, CVD, and a technique of leaving an element to react in a reactive gas atmosphere having an appropriate partial pressure at an appropriate temperature.

The magnetic heads and MRAMs described in the above examples can be produced by a physical or chemical etching technique used in a general semiconductor process, such as ion milling, RIE, FB, FIB, I/M or the like. When flattening is required during precision processing, CMP or photolithography using a line width corresponding to the required precision processing is usable. Especially when layers of a magneto-resistive element are formed, it is effective in order to improve the MR ratio to use cluster-ion beam etching in vacuum to flatten the formed layer and then continue forming the subsequent layers.

SPECIFIC EXAMPLE 1

In order to examine the relationship between the shape and positional arrangement of the conductors (electrodes) in the magneto-resistive elements according to the first example and the magnetic characteristics, the magneto-resistive elements 100, 200 and 300 respectively including the conductors as shown in FIGS. 1A, 2 and 3 were produced. Each vertical current type magneto-resistive element 101 was a TMR element and was produced to have an area of 3 $\mu$m×3 $\mu$m. Each magneto-resistive element was produced using a usual photolithography technique.

The TMR elements and the electrodes were produced to have a structure of $Si/SiO_3/Ta_3/Cu_{500}$(electrode)/$Ta_3$/$PtMn_{30}/CoFe_3/Ru_{0.7}/CoFe_3/Al_{0.4}$ (200 Torr; oxidized with pure oxygen for 1 minute)/$Al_{0.3}$ (200 Torr; oxidized with pure oxygen for 1 minute)/$CoFe_2/NiFe_5/Ta_3/Cu_{500}$ (electrode). The MR ratio was 25%, and RA was 25 $\Omega\mu m^2$. In order to provide PtMn with unidirectional anisotropy, the elements were heat-treated at 280° C. for 3 hours in vacuum. An external magnetic field of ±1000 (Oe) was applied in the directions of the unidirectional anisotropy of PtMn (directions to the right and to the left in the sheet of paper of FIG. 1A) and a 60 mA current was applied to the vertical current type magneto-resistive element 101. At this point, a phenomenon was observed in the magneto-resistive element 100 (FIG. 1A) and the magneto-resistive element 200 (FIG. 2) that the inclination angle θ of the MR-H curve in FIG. 1C was larger than that in the case where no current was applied. In the magneto-resistive element 300 (FIG. 3), the relationship between the external magnetic field and the magnetic resistance was almost the same regardless of the amount of the current.

From this phenomenon, it is considered that in the magneto-resistive elements 100 and 200, the magnetic field generated based on the current flowing in the conductors acts as a bias magnetic field applied on the TMR element, especially, the free layer of $CoFe_2/NiFe_5$. In this manner, the linearity of the change in the magnetic resistance of the vertical current type magneto-resistive element 101 with respect to the external magnetic field can be controlled using a bias magnetic field generated based on the current flowing in the conductors, due to a specific arrangement of the conductors. Due to another specific arrangement of the conductors, the synthetic magnetic field generated based on the current flowing in the conductors can be cancelled. In this case, a large amount of current can be applied to the vertical current type magneto-resistive element 101 without considering the bias magnetic field generated based on the current flowing in the conductors.

SPECIFIC EXAMPLE 2

The multiple element magneto-resistive devices 400, 500 and 700 shown respectively in FIGS. 4, 6 and 7 were produced. Each vertical current type magneto-resistive element 101 was produced to have the same structure as that in Specific Example 1 and an area of 3 $\mu$m×3 $\mu$m. The MR ratio was 25%, and RA was 25 $\Omega\mu m^2$. Regarding the multiple element magneto-resistive device 400 (FIG. 4), the current and voltage of each vertical current type magneto-resistive element 101 were measured independently. Regarding the multiple element magneto-resistive device 600 (FIG. 5), the current and voltage of two vertical current type magneto-resistive elements 101 connected in parallel were measured. Regarding the multiple element magneto-resistive device 700 (FIG. 7), the current and voltage of two vertical current type magneto-resistive elements 101 connected in series were measured.

For the multiple element magneto-resistive device 400, an external magnetic field of ±1000 (Oe) was applied in the directions of the unidirectional anisotropy of PtMn (directions to the right and to the left in the sheet of paper of FIG. 4). First, a 60 mA current was applied to one of the two vertical current type magneto-resistive elements 101, and a change in the voltage was examined. The resultant MR-H curve was substantially the same as the MR-H curve obtained with the magneto-resistive element 300 (Specific Example 1, FIG. 3). At this point, the MR ratio was 19%. Then, a 60 mA current was applied to each of the two vertical current type magneto-resistive elements 101 in a direction perpendicular to the surface of the layers (arrow 106Bb). The inclination angle θ of the MR-H curve in FIG. 1C was larger than that in the case where the current was applied to one of the vertical current type magneto-resistive elements 101.

For the multiple element magneto-resistive device 500, a 120 mA current was applied to the vertical current type magneto-resistive elements 101. A phenomenon was observed where the inclination angle θ of the MR-H curve in FIG. 1C was larger than that in FIG. 1B. When the amount of the current was reduced to 60 mA, inclination angle of the MR-H curve was decreased. For the multiple element magneto-resistive device 700, a 60 mA current was applied to the vertical current type magneto-resistive elements 101. A phenomenon was observed where the inclination angle θ of the MR-H curve in FIG. 1C was larger than that in FIG. 1B. The MR ratio at this point was 23%.

In this manner, a bias magnetic field acting on one of the vertical current type magneto-resistive elements can be generated based on the current flowing in the other vertical current type magneto-resistive element. An appropriate magnitude of the bias magnetic field in a preferable angle (for example, 90 degrees) with respect to the external magnetic field can be applied by adjusting the current in consideration of the influence of the conductors on the magnetic field, the direction of the current direction, the amount of the current, and the distance of two vertical current type magneto-resistive elements. Thus, the linearity of the change in the magnetic response of the multiple element magneto-resistive device with respect to the external magnetic field can be improved. The bias magnetic field dependence of the MR ratio can be suppressed by connecting two vertical current type magneto-resistive elements in series.

As another example of vertical current type magneto-resistive elements connected in series, two vertical current type magneto-resistive elements 101 (GMR elements) connected as shown in FIG. 10 were produced. The vertical current type magneto-resistive elements 101 were produced by precision-processing an Fe/Cr artificial lattice having a thickness of 200 nm into a cylinder having a diameter of 0.3 $\mu$m using a stepper. The vertical current type magneto-resistive elements 101 thus connected are CPP GMR elements.

The MR ratio of the connected vertical current type magneto-resistive elements 101 was examined with a maximum magnetic field of ±1000 (Oe). The MR ratio was 58%.

The steps shown in FIGS. 12 through 16, i.e., the steps of laminating the vertical current type magneto-resistive elements 101 and conductors 102F, 103F and 109F each having a thickness of 200 nm and formed of Cu while flattening the surfaces thereof by a CMP technique, were repeated so as to connect 20 vertical current type magneto-resistive elements 101 in series. The resistance of the entirety of the connected 20 vertical current type magneto-resistive elements 101 was 5 Ω, and the MR ratio thereof was 47%. The cause of the reduction in the MR ratio is considered to be that the resistance of the entirety of the connected 20 vertical current type magneto-resistive elements 101 was increased due to the lamination of the Cu conductors and the vertical current type magneto-resistive elements 101.

A combination of the vertical current type magneto-resistive elements 101 connected in series in a direction perpendicular to the substrate and the vertical current type magneto-resistive elements 101 connected in series parallel to the substrate (FIG. 7) can improve the resistance of a CPP GMR element, which has inherently a low resistance, and increase the voltage output for a given amount of current.

In the case where, as shown in FIG. 17, two (for example) vertical current type magneto-resistive elements 101 (TMR elements) are connected in series by the nonmagnetic conductive layers 1702, 1703 and 1709, and the connected elements 101 and the layers are interposed between the write line 1704 and the bit line 1705 to form the memory cell 1700 of an MRAM the memory cell 1700 (recording cell) has a small level of bias magnetic field dependence.

SPECIFIC EXAMPLE 3

The multiple element magneto-resistive device 1800 shown in FIGS. 18, 19A and 19B was produced. The multiple element magneto-resistive device 1800 includes the yoke 1801 between two vertical current type magneto-resistive elements 101 and the substrate 401. The two vertical current type magneto-resistive elements 101 were connected as shown in FIG. 20A. Each of the vertical current type magneto-resistive elements 101 had an area of 1 μm×2 μm. The vertical current type magneto-resistive elements 101 were located so that the longitudinal direction thereof is perpendicular to the direction in which the magnetic field runs in the yoke 1801.

Each vertical current type magneto-resistive element 101 had a structure shown in FIG. 20B. The specific structure was AlTiC (substrate)/Ta$_3$/Cu$_{500}$ (electrode)/Ta$_3$/NiFe$_{30}$/CoFe$_2$/Al$_{0.4}$ (200 Torr; oxidized with pure oxygen for 1 minute)/Al$_{0.3}$ (200 Torr; oxidized with pure oxygen for 1 minute)/CoFe$_3$/Ru$_{0.7}$/CoFe$_3$/NiFe$_3$/PtMn$_{(30)}$/Ta$_3$ /Cu$_{500}$ (electrode). The PtMn pin layer was provided with a magnetic field in the direction to the right in the sheet of paper of FIG. 19. The resistance of the two vertical current type magneto-resistive elements 101 connected in series was 20 Ω. When a 10 mA current was applied, a bias magnetic field of about 10 (Oe) was provided to each vertical current type magneto-resistive element 101.

For comparison, the conventional magneto-resistive device 2300 including one vertical current type magneto-resistive element 101 shown in FIG. 22 was produced. The vertical current type magneto-resistive element 101 had an area of 1 μm×1 μm and a resistance of 20 Ω. Each of the multiple element magneto-resistive device 1800 and the conventional magneto-resistive device 2300 was subjected to a reproduction test. In the reproduction test, information recorded on a magnetic recording medium of an HDD at a track density of 90 kTPI (tracks per inch) and a line recording density of 550 kBPI (bits per inch) was reproduced at a data transfer rate of 211 Mbits/sec. The magnetic head was 20 nm above the magnetic recording medium. The bit error ratio of the multiple element magneto-resistive device 1800 was $1 \times 10^{-7}$, and the bit error ratio of the conventional magneto-resistive device 2300 was $1 \times 10^{-5}$. It is considered that the multiple element magneto-resistive device 1800 had such a lower bit error ratio because, for example, (i) the series connection of the vertical current type magneto-resistive elements 101 alleviates the reduction in the MR ratio and (ii) the bias magnetic field generated by the current improves the linearity of the MR-H curve.

The structure of the multiple element magneto-resistive device 1500 shown in FIGS. 18, 19A and 19B has a feature that the external magnetic fields running into the two vertical current type vertical current type magneto-resistive elements 101 (TMR elements) are of the same phase. The multiple element magneto-resistive devices 2900 (FIG. 29), 3500 (FIGS. 35A and 35B), 3600 (FIG. 36) and 3800 (FIG. 38), including vertical current type magneto-resistive elements 101 between the yoke and the substrate fundamentally operate in the same manner as the multiple element magneto-resistive device 1800. The element magneto-resistive devices 2900, 3500, 3600 and 3800 provided a superb bit error ratio similar to that of the multiple element magneto-resistive device 1800. The element magneto-resistive devices 2900, 3500, 3600 and 3800 were produced using the structure shown in FIG. 33.

SPECIFIC EXAMPLE 4

The multiple element magneto-resistive device 2400 shown in FIGS. 24, 25A and 25B was produced. The multiple element magneto-resistive device 2400 includes two vertical current type magneto-resistive elements 101 and 101E, and the yoke 1801 between the substrate 401 and the vertical current type magneto-resistive elements 101 and 101E. The two vertical current type magneto-resistive elements 101 and 101E were connected as shown in FIG. 26. Each of the vertical current type magneto-resistive elements 101 and 101E had an area of 0.5 μm×1 μm. The vertical current type magneto-resistive elements 101 and 101E were located so that the longitudinal direction thereof is perpendicular to the direction in which the magnetic field runs in the yoke 1801 (arrow 1802). Each vertical current type magneto-resistive element 101 had a structure shown in FIG. 23D.

With reference to FIG. 23D, the conductor 102D was formed on the substrate 401. Then, the hard magnetic layer or the anti-ferromagnetic layer 2301 was formed by lift-off photolithography to form side electrodes. Then, the surface of the conductor 102D and the layer 2301 was flattened. Then, cluster ion beam etching was performed in vacuum to further smooth and clean the surface. The specific structure of the TMR element was AlTiC (substrate)/Ta$_3$/Cu$_{500}$ (electrode)/Ta$_3$/NiFe$_{30}$/CoFe$_2$/Al$_{0.4}$ (200 Torr: oxidized with pure oxygen for 1 minute)/Al$_{0.25}$ (200 Torr: oxidized with pure oxygen for 1 minute) /CoFe$_3$/Ru$_{0.7}$/CoFe$_3$/NiFe$_3$/PtMn$_{(30)}$/Ta$_3$/Cu$_{500}$ (electrode). The PtMn pin layer was provided with a magnetic field in a running direction of the external magnetic field 108 (arrow 1802). CoPt was used for the hard magnetic layer or the anti-ferromagnetic layer 2301. The PtMn layer was provided with anisotropy so as to be supplied by a perpendicular bias magnetic field. Each of the vertical current type magneto-resistive elements 101 and 101E had a resistance of 20 Ω.

The outputs obtained from the vertical current type magneto-resistive elements 101 and 101E have opposite values with respect to the same external magnetic field 108 as shown in FIGS. 27A and 27B. The difference between the output E1 from the vertical current type magneto-resistive element 101 and the output E2 from the vertical current type magneto-resistive element 101E was amplified by a differential amplifier acting as the subtractor 2002.

The multiple element magneto-resistive device 2400 was subjected to a reproduction test in the reproduction test, information recorded on a magnetic recording medium of an HDD at a track density of 90 kTPI (tracks per inch) and a line recording density of 550 kBPI (bits per inch) was reproduced at a data transfer rate of 211 Mbits/sec. The magnetic head was 20 nm above the magnetic recording medium. The bit error ratio of the multiple element magneto-resistive device 2400 was $1 \times 10^{-8}$. This is lower even than the value obtained with the multiple element magneto-resistive device 1800, It is considered that such a superior reproduction output is obtained because use of the differential output counteracts a thermal spike which is generated when the magnetic head contacts the magnetic recording medium due to thermal fluctuation and narrow flight height.

SPECIFIC EXAMPLE 5

The multiple element magneto-resistive device 2900 shown in FIGS. 29, 30A and 30B was produced. The multiple element magneto-resistive device 2900 includes two vertical current type magneto-resistive elements 101 and 101E which are interposed between the yoke 1801 and the substrate 401. The two vertical current type magneto-resistive elements 101 and 101E were connected as shown in FIG. 32. Each of the vertical current type magneto-resistive elements 101 and 101E had an area of 0.5 $\mu$m×1 $\mu$m. The vertical current type magneto-resistive elements 101 and 101E were located so that the longitudinal direction thereof is perpendicular to the direction in which the magnetic field runs in the yoke 1801 (arrow 1802). Each vertical current type magneto-resistive element 101 had a structure shown in FIG. 34.

The specific structure of the TMR element was AlTiC/ $Ta_3/Cu_{500}$ (electrode)/$Ta_3/PtMn_{30}/CoFe_3/Ru_{0.7}/CoFe_3/Al_{0.4}$/(200 Torr; oxidized with pure oxygen for 1 minute)/ $Al_{0.25}$ (200 Torr; oxidized with pure oxygen for 1 minute)/ $CoFe_2/NiFe_{30}/Ta_3/Cu_{500}$ (electrode). The PtMn pin layer was provided with a magnetic field in a running direction of the external magnetic field 108 (arrow 1802). Each of the vertical current type magneto-resistive elements 101 and 101E had a resistance of 20 Ω.

The outputs obtained from the vertical current type magneto-resistive elements 101 and 101E have opposite values with respect to the same external magnetic field 108 as shown in FIGS. 27A and 27B. The difference between the output E1 from the vertical current type magneto-resistive element 101 and the output E2 from the vertical current type magneto-resistive element 101E was amplified by a differential amplifier acting as the subtractor 2002.

The multiple element magneto-resistive device 2900 was subjected to a reproduction test. In the reproduction test, information recorded on a magnetic recording medium of an HDD at a track density of 90 kTPI (tracks per inch) and a line recording density of 550 kBPI (bits per inch) was reproduced at a data transfer rate of 211 Mbits/sea. The magnetic head was 20 nm above the magnetic recording medium. The bit error ratio of the multiple element magneto-resistive device 2900 was $1 \times 10^{-8}$. This is substantially equal to the value obtained in Specific Example 4 with the multiple element magneto-resistive device 2400. It is considered that such a superior reproduction output is obtained because use of the differential output counteracts a thermal spike which is generated when the magnetic head contacts the magnetic recording medium due to thermal fluctuation and narrow flight height.

As described above, the present invention provides a magneto-resistive element and a multiple element magneto-resistive device for adjusting a bias magnetic field applied on a vertical current type magneto-resistive element therein with a simple structure.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A multiple element magneto-resistive device, comprising:
    a first vertical current type magneto-resistive element responding to a specific external magnetic field; and
    a second vertical current type magneto-resistive element responding to the specific external magnetic field,
    wherein:
        the first vertical current type magneto-resistive element generates a first magnetic field based on a current therein,
        the second vertical current type magneto-resistive element generates a second magnetic field based on a current therein, and
        the first vertical current type magneto-resistive element and the second vertical current type magneto-resistive element are located so that the first magnetic field and the second magnetic field act as a bias magnetic field applied on the multiple element magneto-resistive device.

2. A multiple element magneto-resistive device according to claim 1, wherein the first vertical current type magneto-resistive element and the second vertical current type magneto-resistive element are electrically connected to each other in series.

3. A multiple element magneto-resistive device according to claim 1, further comprising:
    a first conductor for causing the current to flow into the first vertical current type magneto-resistive element,
    a second conductor for causing the current flowing out of the first vertical current type magneto-resistive element to flow into the second vertical current type magneto-resistive element, and
    a third conductor for causing the current to flow out of the second vertical current type magneto-resistive element.

4. A multiple element magneto-resistive device according to claim 3, wherein the first vertical current type magneto-resistive element is located on the same side as the second vertical current type magneto-resistive element with respect to the second conductor.

5. A multiple element magneto-resistive device according to claim 3, wherein the first vertical current type magneto-resistive element is located on an opposite side to the second vertical current type magneto-resistive element with respect to the second conductor.

6. A multiple element magneto-resistive device according to claim 1, wherein the first vertical current type magnetoresistive element and the second vertical current type magneto-resistive element are electrically connected to each other in parallel.

7. A multiple element magneto-resistive device according to claim 1, further comprising:
   a first conductor for causing the current to flow into the first vertical current type magneto-resistive element and the second vertical current type magneto-resistive element, and
   a second conductor for causing the current to flow out of the first vertical current type magneto-resistive element and the second vertical current type magneto-resistive element.

8. A multiple element magneto-resistive device according to claim 1, further comprising:
   a first conductor for causing the current to flow into the first vertical current type magneto-resistive element,
   a second conductor for causing the current to flow out of the first vertical current type magneto-resistive element,
   a third conductor for causing the current to flow into the second vertical current type magneto-resistive element, and
   a fourth conductor for causing the current to flow out of the second vertical current type magneto-resistive element,
   wherein:
      the first conductor generates a first magnetic field based on the current flowing therein,
      the second conductor generates a second magnetic field based on the current flowing therein,
      the first conductor and the second conductor are located so that the first magnetic field and the second magnetic field act as a bias magnetic field applied on the first vertical current type magneto-resistive element,
      the third conductor generates a third magnetic field based on the current flowing therein,
      the fourth conductor generates a fourth magnetic field based on the current flowing therein, and
      the third conductor and the fourth conductor are located so that the third magnetic field and the fourth magnetic field act as a bias magnetic field applied on the second vertical current type magneto-resistive element.

9. A multiple element magneto-resistive device according to claim 1, further comprising:
   a first conductor for causing the current to flow into the first vertical current type magneto-resistive element,
   a second conductor for causing the current to flow out of the first vertical current type magneto-resistive element,
   a third conductor for causing the current to flow into the second vertical current type magneto-resistive element, and
   a fourth conductor for causing the current to flow out of the second vertical current type magneto-resistive element,
   wherein:
      the first conductor generates a first magnetic field based on the current flowing therein,
      the second conductor generates a second magnetic field based on the current flowing therein,
      the first conductor and the second conductor are located so that the first magnetic field and the second magnetic field cancel each other,
      the third conductor generates a third magnetic field based on the current flowing therein,
      the fourth conductor generates a fourth magnetic field based on the current flowing therein, and
      the third conductor and the fourth conductor are located so that the third magnetic field and the fourth magnetic field cancel each other.

10. A multiple element magneto-resistive device according to claim 1, further comprising a yoke on which the first vertical current type magneto-resistive element and the second vertical current type magneto-resistive element are provided.

11. A multiple element magneto-resistive device according to claim 10, further comprising a substrate provided on an opposite side to the first and second vertical current type magneto-resistive elements with respect to the yoke.

12. A multiple element magneto-resistive device according to claim 10, further comprising a substrate provided on an opposite side to the yoke with respect to the first and second vertical current type magneto-resistive elements.

13. A multiple element magneto-resistive device according to claim 10, wherein the yoke is a horizontal yoke.

14. A multiple element magneto-resistive device according to claim 10, wherein the yoke is a vertical yoke.

15. A multiple element magneto-resistive device according to claim 1, wherein each of the first vertical current type magneto-resistive element and the second vertical current type magneto-resistive element includes:
   an anti-ferromagnetic layer;
   a fixed layer; and
   a non-magnetic layer provided on an opposite side to the anti-ferromagnetic layer with respect to the fixed layer.

16. A multiple element magneto-resistive device according to claim 1, further comprising an adder for adding an output of the first vertical current type magneto-resistive element and an output of the second vertical current type magneto-resistive element so as to detect the specific external magnetic field.

17. A multiple element magneto-resistive device according to claim 16, wherein the first vertical current type magneto-resistive element and the second vertical current type magneto-resistive element have different polarities from each other.

18. A multiple element magneto-resistive device according to claim 1, further comprising a subtractor for processing an output of the first vertical current type magneto-resistive element and an output of the second vertical current type magneto-resistive element with subtraction so as to detect the specific external magnetic field.

19. A multiple element magneto-resistive device according to claim 18, wherein the first vertical current type magneto-resistive element and the second vertical current type magneto-resistive element have different polarities from each other.

20. A multiple element magneto-resistive device according to claim 1, wherein the first and second vertical current type magneto-resistive elements detect a change in a relative magnetization angle between at least two magnetic bodies as a change in a tunneling probability of electrons.

21. A multiple element magneto-resistive device according to claim 1, wherein the first and second vertical current type magneto-resistive elements detect a change in a relative magnetization angle between at least two magnetic bodies as a change in a mean free path of electrons.

22. A magnetic random access memory including a multiple element magneto-resistive devices the multiple element magneto-resistive device comprising:

a first vertical current type magneto-resistive element responding to a specific external magnetic field; and a second vertical current type magneto-resistive element responding to the specific external magnetic field, wherein:

the first vertical current type magneto-resistive element generates a first magnetic field based on a current therein, the second vertical current type magneto-resistive element generates a second magnetic field based on a current therein, and the first vertical current type magneto-resistive element and the second vertical current type magneto-resistive element are located so that the first magnetic field and the second magnetic field act as a bias magnetic field applied on the multiple element magneto-resistive device.

23. A magnetic random access memory according to claim 22, wherein the first vertical current type magneto-resistive element and the second vertical current type magneto-resistive element are electrically connected to each other in series.

24. A magnetic random access memory according to claim 22, further comprising:

a first conductor for causing the current to flow into the first vertical current type magneto-resistive element, a second conductor for causing the current flowing out of the first vertical current type magneto-resistive element to flow into the second vertical current type magneto-resistive element, and a third conductor for causing the current to flow out of the second vertical current type magneto-resistive element.

25. A magnetic random access memory according to claim 24, wherein the first vertical current type magneto-resistive element is provided on an opposite side to the second vertical current type magneto-resistive element with respect to the second conductor.

* * * * *

UNITED STATES PATENT AND TRADEMARK OFFICE
CERTIFICATE OF CORRECTION

PATENT NO.    : 6,717,780 B2
DATED         : April 6, 2004
INVENTOR(S)   : Hiramoto et al.

It is certified that error appears in the above-identified patent and that said Letters Patent is hereby corrected as shown below:

<u>Title page</u>,
Item [30], Foreign Application Priority Data, "May 10, 2000" should read
-- October 5, 2000 --.

<u>Column 38</u>,
Line 66, "devices" should read -- device, --.

Signed and Sealed this

Twenty-first Day of September, 2004

JON W. DUDAS
*Director of the United States Patent and Trademark Office*